(12) United States Patent
Suk et al.

(10) Patent No.: US 10,991,694 B2
(45) Date of Patent: Apr. 27, 2021

(54) SEMICONDUCTOR DEVICE

(71) Applicant: Samsung Electronics Co., Ltd., Suwon-si (KR)

(72) Inventors: Sung-Dae Suk, Seoul (KR); Jongho Lee, Seoul (KR); Geumjong Bae, Suwon-si (KR)

(73) Assignee: Samsung Electronics Co., Ltd.

( * ) Notice: Subject to any disclaimer, the term of this patent is extended or adjusted under 35 U.S.C. 154(b) by 42 days.

(21) Appl. No.: 16/137,625

(22) Filed: Sep. 21, 2018

(65) Prior Publication Data

US 2019/0027475 A1 Jan. 24, 2019

Related U.S. Application Data

(63) Continuation of application No. 15/438,113, filed on Feb. 21, 2017, now Pat. No. 10,109,631.

(30) Foreign Application Priority Data

Feb. 26, 2016 (KR) .......................... 10-2016-0023242

(51) Int. Cl.
*H01L 27/092* (2006.01)
*H01L 21/8238* (2006.01)
(Continued)

(52) U.S. Cl.
CPC .. *H01L 27/0924* (2013.01); *H01L 21/823807* (2013.01); *H01L 21/823814* (2013.01); *H01L 21/823871* (2013.01); *H01L 23/535* (2013.01); *H01L 27/092* (2013.01); *H01L 29/41791* (2013.01); *H01L 29/42392* (2013.01); *H01L 29/66545* (2013.01); *H01L 29/785* (2013.01); *H01L 29/7845* (2013.01);
(Continued)

(58) Field of Classification Search
None
See application file for complete search history.

(56) References Cited

U.S. PATENT DOCUMENTS 7,816,240 B2  10/2010  Faulkner
8,841,189 B1   9/2014  Cheng
(Continued)

FOREIGN PATENT DOCUMENTS

JP        5916747        5/2016
KR     20120085928       8/2012

*Primary Examiner* — Moazzam Hossain
*Assistant Examiner* — Stanetta D Isaac
(74) *Attorney, Agent, or Firm* — Myers Bigel, P.A.

(57) ABSTRACT

A semiconductor device includes an insulating layer on a substrate, a channel region on the insulating layer, a gate structure on the insulating layer, the gate structure crossing the channel region, source/drain regions on the insulating layer, the source/drain regions being spaced apart from each other with the gate structure interposed therebetween, the channel region connecting the source/drain regions to each other, and contact plugs connected to the source/drain regions, respectively. The channel region includes a plurality of semiconductor patterns that are vertically spaced apart from each other on the insulating layer, the insulating layer includes first recess regions that are adjacent to the source/drain regions, respectively, and the contact plugs include lower portions provided into the first recess regions, respectively.

13 Claims, 45 Drawing Sheets

(51) Int. Cl.
  *H01L 29/66* (2006.01)
  *H01L 29/78* (2006.01)
  *H01L 29/423* (2006.01)
  *H01L 29/786* (2006.01)
  *H01L 23/535* (2006.01)
  *H01L 29/417* (2006.01)

(52) U.S. Cl.
  CPC ...... *H01L 29/7848* (2013.01); *H01L 29/7849* (2013.01); *H01L 29/78696* (2013.01)

(56) References Cited

U.S. PATENT DOCUMENTS

| | | |
|---|---|---|
| 9,082,788 B2 | 7/2015 | Loubet |
| 2006/0240622 A1 | 10/2006 | Lee |
| 2011/0133165 A1* | 6/2011 | Bangsaruntip ........ H01L 29/458 257/24 |
| 2011/0147840 A1 | 6/2011 | Cea |
| 2013/0341704 A1 | 12/2013 | Rachmady |
| 2015/0108573 A1 | 4/2015 | Liu |
| 2015/0140793 A1 | 5/2015 | Gotsmann |
| 2015/0270340 A1 | 9/2015 | Frank |
| 2015/0325481 A1* | 11/2015 | Radosavljevic ............................ H01L 21/823821 438/154 |
| 2017/0133462 A1* | 5/2017 | Kuhn ................. H01L 29/0673 |

* cited by examiner

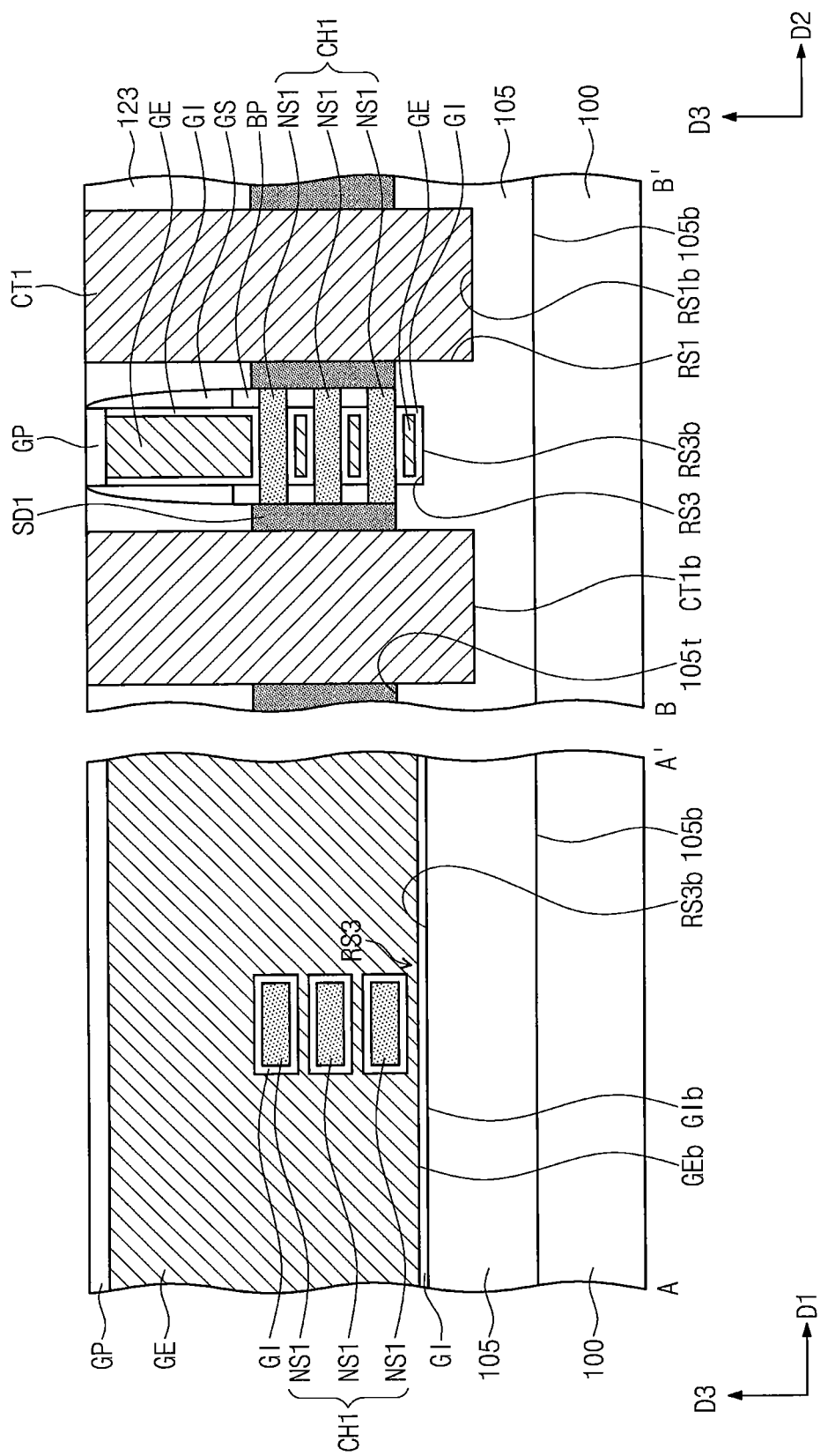

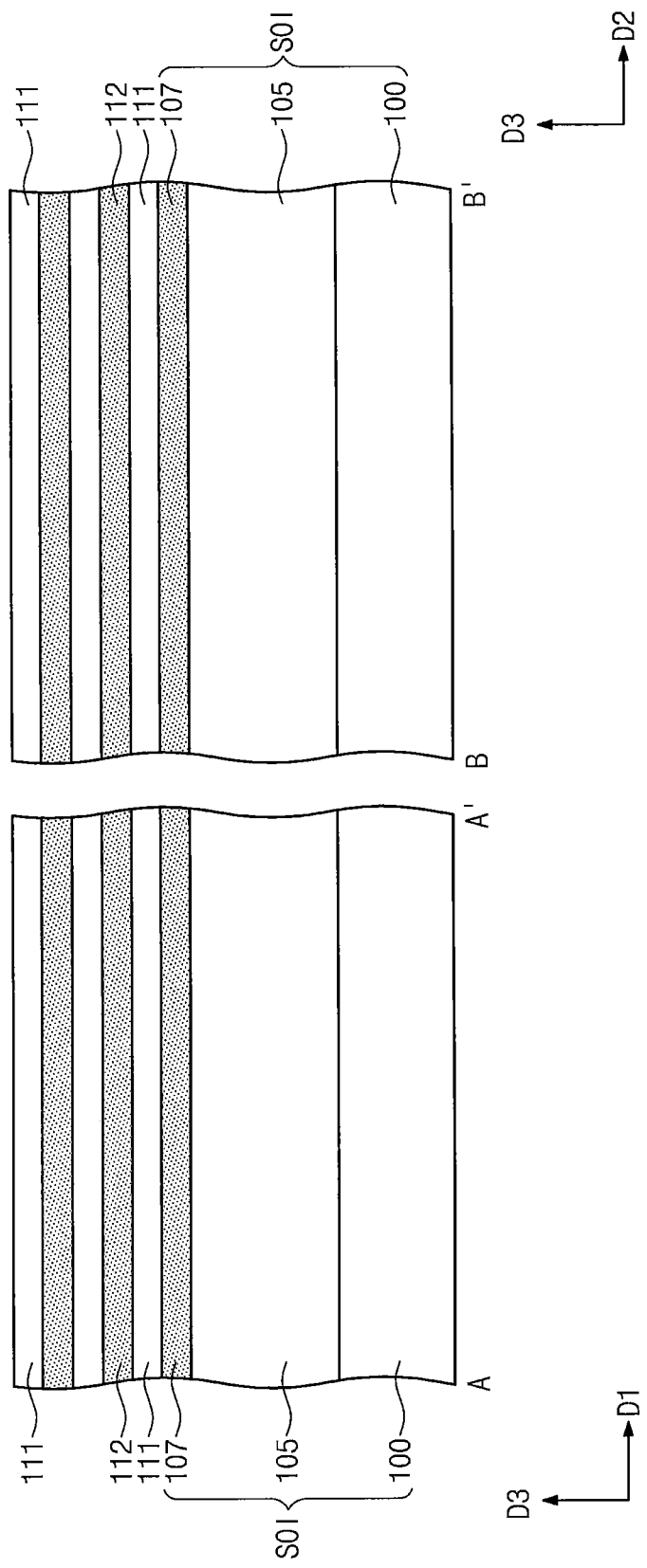

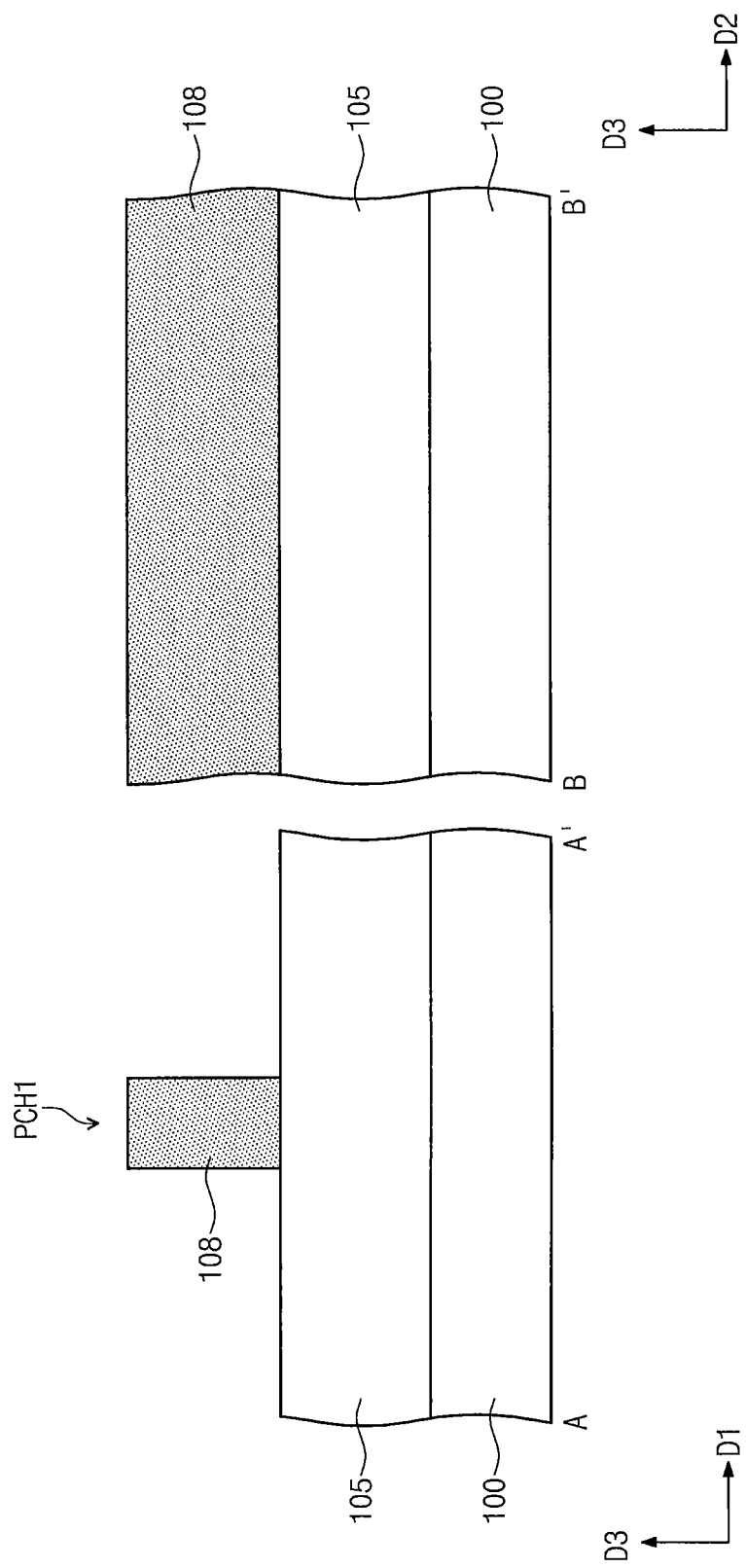

SEMICONDUCTOR DEVICE

CROSS-REFERENCE TO RELATED APPLICATIONS

This application is a continuation application of and claims priority from U.S. patent application Ser. No. 15/438,113, filed on Feb. 21, 2017, which claims priority under 35 U.S.C. § 119 to Korean Patent Application No. 10-2016-0023242, filed on Feb. 26, 2016, in the Korean Intellectual Property Office, the disclosure of which is hereby incorporated by reference herein in its entirety.

BACKGROUND

The present inventive concepts relate to semiconductor devices, and in particular, to semiconductor devices including field effect transistors.

Due to their small-size, multifunction, and/or low-cost characteristics, semiconductor devices can be important elements in the electronic industry. Semiconductor devices may be classified into memory devices for storing data, logic devices for processing data, and hybrid devices including both memory and logic elements. To meet increased demand for electronic devices with fast speed and/or low power consumption, it may be desirable to realize semiconductor devices with high reliability, high performance, and/or multiple functions. To address or satisfy these technical requirements, complexity and/or integration density of semiconductor devices may be increased.

SUMMARY

Some embodiments of the inventive concepts provide a semiconductor device, in which field effect transistors with improved electric characteristics (e.g., carrier mobility) are provided.

According to some embodiments of the inventive concepts, a semiconductor device may include an insulating layer on a substrate, a channel region on the insulating layer, a gate structure on the insulating layer, the gate structure crossing the channel region and extending in a direction, source/drain regions on the insulating layer, the source/drain regions being spaced apart from each other with the gate structure interposed therebetween, the channel region connecting the source/drain regions to each other, and contact plugs connected to the source/drain regions, respectively. The channel region may include a plurality of semiconductor patterns that are vertically spaced apart from each other on the insulating layer, the insulating layer may include first recess regions that are adjacent to the source/drain regions, respectively, and the contact plugs may include lower portions provided into the first recess regions, respectively.

According to some embodiments of the inventive concepts, a semiconductor device may include an insulating layer on a substrate, a first transistor on the insulating layer, the first transistor including a first gate structure extending in a direction, first source/drain regions spaced apart from each other with the first gate structure interposed therebetween, and a first channel region connecting the first source/drain regions to each other, a second transistor on the insulating layer, the second transistor including a second gate structure extending in the direction, second source/drain regions spaced apart from each other with the second gate structure interposed therebetween, and a second channel region connecting the second source/drain regions to each other, first contact plugs connected to the first source/drain regions, respectively, and second contact plugs connected to the second source/drain regions, respectively. The first source/drain regions have conductivity types different from those of the second source/drain regions, bottom surfaces of the first contact plugs may be positioned at a level that is lower than that of a top surface of the insulating layer, and bottom surfaces of the second contact plugs may be positioned at a level that is equal to or higher than that of the top surface of the insulating layer.

According to some embodiments of the inventive concepts, a semiconductor device includes a semiconductor transistor structure on a surface of an insulating layer on a substrate. The semiconductor transistor structure includes source/drain regions at opposite ends thereof, a channel region extending between the source drain regions, and a gate electrode on the channel region. Respective contact plugs extend towards the substrate through the source/drain regions and into the surface the insulating layer beyond the channel region thereon. The respective contact plugs include a metal material that exerts a strain on the channel region. For example, the metal material may be a conductive metal nitride or metal that exerts the strain on the channel region, such that the strain on the channel region is a tensile strain that is greater or more uniform than that provided by a semiconductor material of the source/drain regions.

Other devices and/or methods according to some embodiments will become apparent to one with skill in the art upon review of the following drawings and detailed description. It is intended that all such additional embodiments, in addition to any and all combinations of the above embodiments, be included within this description, be within the scope of the inventive concepts, and be protected by the accompanying claims.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

FIG. 1B is a sectional view taken along lines A-A' and B-B' of FIG. 1A.

FIGS. 2B, 3B, 4B, 5B, 6B, 7B, 8B, 9B, and 10B are sectional views taken along lines A-A' and B-B' of FIGS. 2A, 3A, 4A, 5A, 6A, 7A, 8A, 9A, and 10A, respectively.

FIGS. 12B, 13B, 14B, 15B, and 16B are sectional views taken along lines A-A' and B-B' of FIGS. 12A, 13A, 14A, 15A, and 16A, respectively.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION OF EMBODIMENTS

Figure 1A:
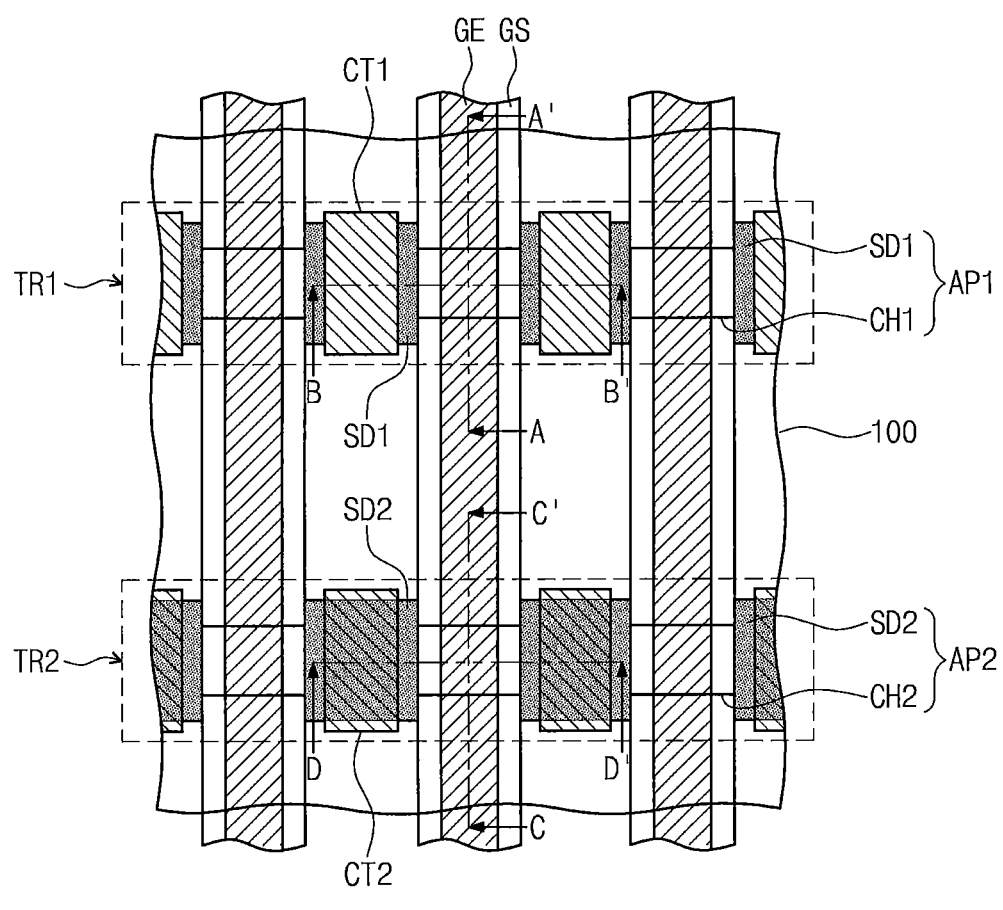
FIG. 1A is a plan view of a semiconductor device according to some embodiments of the inventive concepts.
Figure 1A:
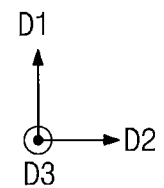
Figure 1C:
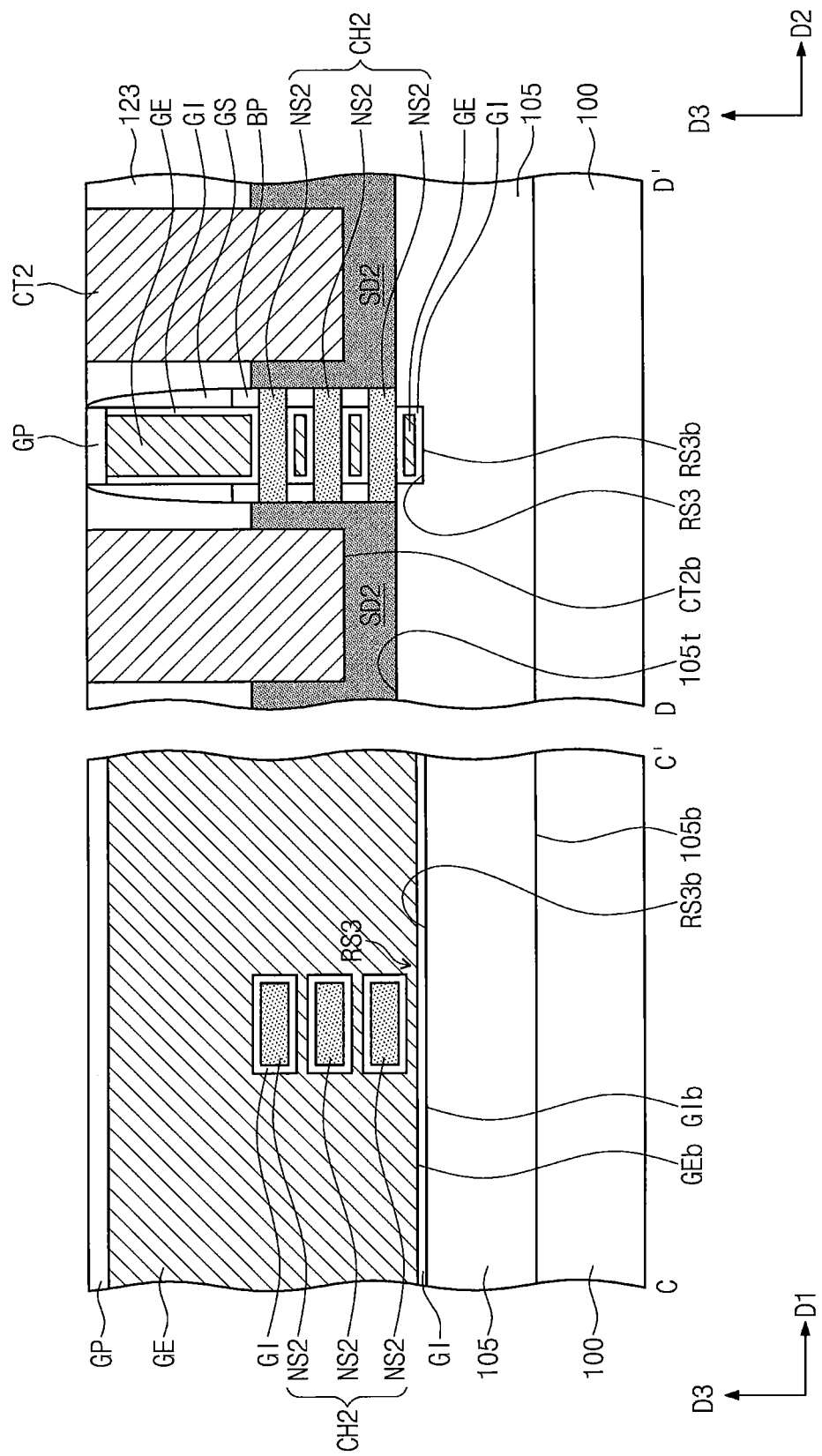
FIG. 1C is a sectional view taken along lines C-C' and D-D' of FIG. 1A.

FIG. 1A is a plan view of a semiconductor device according to some embodiments of the inventive concepts. FIG. 1B is a sectional view taken along lines A-A' and B-B' of FIG. 1A. FIG. 1C is a sectional view taken along lines C-C' and D-D' of FIG. 1A.

Referring to FIGS. 1A to 1C, an insulating layer 105 may be provided on a substrate 100. The substrate 100 may be a semiconductor substrate. For example, the substrate 100 may be a silicon wafer or a germanium wafer. The insulating layer 105 may be formed of or include at least one of a silicon oxide layer, a silicon nitride layer, or a silicon oxynitride layer. In some embodiments, the substrate 100 and the insulating layer 105 may be parts of a silicon-on-insulator (SOI) wafer. In other words, the substrate 100 may be a handling substrate of the SOI wafer, and the insulating layer 105 may be an insulator of the SOI wafer.

First and second transistors TR1 and TR2 may be provided on the insulating layer 105. The first and second transistors TR1 and TR2 may be formed on a region of the substrate 100. The region of the substrate 100 may be a memory cell region, on which memory cells for storing data are formed. For example, memory cell transistors constituting or defining a plurality of static random access memory (SRAM) cells may be provided on the memory cell region of the substrate 100, and the first and second transistors TR1 and TR2 may be some of the memory cell transistors.

Alternatively, the region of the substrate 100 may be a logic cell region, on which logic transistors constituting or defining a logic circuit are formed. For example, logic transistors constituting or defining a processor core or I/O terminals may be provided on the logic cell region of the substrate 100, and the first and second transistors TR1 and TR2 may be some of the logic transistors. However, the inventive concepts may not be limited thereto.

The first and second transistors TR1 and TR2 may have semiconductor conductivity types different from each other. As an example, the first transistor TR1 may be an n-type metal-oxide semiconductor field-effect transistor (NMOSFET), and the second transistor TR2 may be a p-type MOSFET (PMOSFET).

Each of the first and second transistors TR1 and TR2 may include a plurality of gate structures extending in a first direction D1. The first and second transistors TR1 and TR2 may include first and second active regions AP1 and AP2, respectively. The first and second active regions AP1 and AP2 may extend in a second direction D2 crossing the first direction D1. For simplicity, the description that follows will refer to one of the gate structures.

The gate structure may be disposed to cross the first active region AP1 of the first transistor TR1. The gate structure may be disposed to cross the second active region AP2 of the second transistor TR2. As an example, the gate structure may be disposed to cross both the first and second active regions AP1 and AP2. In certain embodiments, different gate structures may be disposed to cross the first and second active regions AP1 and AP2, respectively.

The gate structure may include a gate electrode GE, a gate insulating pattern GI extending along side and bottom surfaces of the gate electrode GE, a pair of gate spacers GS spaced apart from the gate electrode GE by the gate insulating pattern GI interposed therebetween, and a gate capping pattern GP extending on or covering the gate electrode GE and the gate insulating pattern GI. Top surfaces of the gate insulating pattern GI and the gate electrode GE may be in contact with a bottom surface of the gate capping pattern GP.

The gate electrode GE may be formed of or include doped semiconductor materials, conductive metal nitrides, and/or metals. As an example, the gate electrode GE may include metal nitrides (e.g., TiN, WN and TaN) and/or metals (e.g., Ti, W, and Ta). The gate insulating pattern GI may be formed of or include at least one of a silicon oxide layer, a silicon nitride layer, a silicon oxynitride layer, or high-k dielectric materials. The high-k dielectric materials may be dielectric materials (e.g., hafnium oxide (HfO), aluminum oxide (AlO) or tantalum oxide (TaO)), whose dielectric constants are higher than that of silicon oxide. Each of the gate spacer GS and the gate capping pattern GP may be formed, of or include at least one of a silicon oxide layer, a silicon nitride layer, or a silicon oxynitride layer.

The first active region AP1 may include a first channel region CH1 and first source/drain regions SD1, which are spaced apart from each other in the second direction D2 with the first channel region CH1 interposed therebetween. The second active region AP2 may include a second channel region CH2 and second source/drain regions SD2, which are spaced apart from each other in the second direction D2 with the second channel region CH2 interposed therebetween.

The first channel region CH1 may include a plurality of first semiconductor patterns NS1 which are vertically stacked on the substrate 100. The first semiconductor patterns NS1 may be spaced apart from each other in a direction D3 perpendicular to a top surface of the substrate 100. Each of the first source/drain regions SD1 may be in direct contact with side surfaces of the first semiconductor patterns NS1. In other words, each of the first semiconductor patterns NS1 may connect the first source/drain regions SD1 to each other. The number of the first semiconductor patterns NS1 may be three as shown in FIG. 1B, but the inventive concepts may not be limited thereto.

The second channel region CH2 may include a plurality of second semiconductor patterns NS2 which are vertically stacked on the substrate 100. The second semiconductor patterns NS2 may be spaced apart from each other in the direction D3 perpendicular to the top surface of the substrate 100. Each of the second source/drain regions SD2 may be in direct contact with side surfaces of the second semiconductor patterns NS2. In other words, each of the second semiconductor patterns NS2 may connect the second source/drain regions SD2 to each other. The number of the second semiconductor patterns NS2 may be three as shown in FIG. 1C, but the inventive concepts may not be limited thereto.

The first and second semiconductor patterns NS1 and NS2 located at the same level may be formed from the same semiconductor layer. Thus, they may have substantially the same thickness. The first and second semiconductor patterns NS1 and NS2 may be formed of or include Si, SiGe, and/or Ge. In some embodiments, the first semiconductor patterns NS1 may be provided to have substantially the same thickness, but the inventive concepts may not be limited thereto. Similarly, the second semiconductor patterns NS2 may be provided to have substantially the same thickness, but the inventive concepts may not be limited thereto.

As described above, the gate electrode GE and the gate insulating pattern GI may be provided to extend on or cover the first and second channel regions CH1 and CH2 and to extend in the first direction D1. In detail, the gate electrode GE and the gate insulating pattern GI may be provided to fill spaces between the first semiconductor patterns NS1. Here, the gate insulating pattern GI may be in direct contact with the first semiconductor patterns NS1, and the gate electrode GE may be spaced apart from the first semiconductor patterns NS1 with the gate insulating pattern GI interposed therebetween.

The gate electrode GE and the gate insulating pattern GI may be provided to fill spaces between the second semiconductor patterns NS2. Here, the gate insulating pattern GI may be in direct contact with the second semiconductor patterns NS2, and the gate electrode GE may be spaced apart from the second semiconductor patterns NS2 with the gate insulating pattern GI interposed therebetween.

The gate electrode GE and the gate insulating pattern GI may fill a third recess region RS3, which is formed in a top portion of the insulating layer 105. The third recess region RS3 may be formed below the first channel region CH1 and the second channel region CH2. The third recess region RS3 may extend along the gate structure or in the first direction D1. A bottom RS3b of the third recess region RS3 may be positioned at a lower level than a top surface 105t of the insulating layer 105. In other words, a bottom surface GEb of the gate electrode GE and a bottom surface GIb of the gate insulating pattern GI may be positioned at a lower level than the top surface 105t of the insulating layer 105.

As a result, the gate electrode GE may be provided to enclose an outer circumference surface of each of the first and second semiconductor patterns NS1 and NS2. In other words, each of the first and second transistors TR1 and TR2 may be a gate-all-around (GAA) type field effect transistor having a channel region whose outer circumference surface is enclosed by the gate electrode GE.

Barrier insulating patterns BP may be provided between the first source/drain regions SD1 and the gate electrode GE and between the second source/drain regions SD2 and the gate electrode GE. The barrier insulating patterns BP of the first transistor TR1 may be spaced apart from each other by the first semiconductor patterns NS1 interposed therebetween. The barrier insulating patterns BP of the second transistor TR2 may be spaced apart from each other by the second semiconductor patterns NS2 interposed therebetween. The barrier insulating patterns BP may be in direct contact with the gate insulating pattern GI. The barrier insulating patterns BP may be formed of or include at least one of a silicon oxide layer, a silicon nitride layer, or a silicon oxynitride layer.

The first and second source/drain regions SD1 and SD2 may be epitaxial patterns, which are epitaxially grown from the first and second semiconductor patterns NS1 and NS2 serving as a seed layer. In the case where the first transistor TR1 is an NMOSFET, the first source/drain regions SD1 may include a semiconductor material capable of exerting a tensile strain on the first channel region CH1. As an example, the first source/drain regions SD1 may include a SiC layer, whose lattice constant is smaller than that of Si, or a Si layer, whose lattice constant is substantially the same as that of the substrate 100. The first source/drain regions SD1 may be of an n-type.

In the case where the second transistor TR2 is a PMOSFET, the second source/drain regions SD2 may include a material capable of exerting a compressive strain on the second channel region CH2. As an example, the second source/drain regions SD2 may include a SiGe layer, whose lattice constant is larger than that of Si. The second source/drain regions SD2 may be of a p-type.

An interlayered insulating layer 123 may be provided on the first and second source/drain regions SD1 and SD2. The gate structure may be provided in the interlayered insulating layer 123. A top surface of the interlayered insulating layer 123 may be substantially coplanar with that of the gate capping pattern GP. The interlayered insulating layer 123 may be formed of or include a silicon oxide layer or a silicon oxynitride layer.

First and second contact plugs CT1 and CT2 may be provided to penetrate the interlayered insulating layer 123 and may be connected to the first and second source/drain regions SD1 and SD2, respectively. The first contact plugs CT1 may be in contact with the first source/drain regions SD1, and the second contact plugs CT2 may be in contact with the second source/drain regions SD2.

First recess regions RS1 may be formed in an upper portion of the insulating layer 105, and the first contact plugs CT1 may include lower portions filling the first recess regions RS1, respectively. In other words, the lower portions of the first contact plugs CT1 may be inserted into the insulating layer 105. When viewed in a plan view, the first recess regions RS1 may be overlapped with the first contact plugs CT1, respectively. Bottoms RS1b of the first recess regions RS1 may be positioned between the top surface 105t of the insulating layer 105 and a bottom surface 105b of the insulating layer 105. As an example, the first recess regions RS1 may be deeper than the third recess region RS3. In other words, the bottoms RS1b of the first recess regions RS1 may be positioned at a lower level than the bottom RS3b of the third recess region RS3.

The first contact plugs CT1 may be provided to penetrate and extend through the first source/drain regions SD1. Accordingly, a pair of the first source/drain regions SD1 between a pair of the gate electrodes GE may be spaced apart from each other in the second direction D2 with the first contact plug CT1 interposed therebetween. The first contact plugs CT1 may be vertically spaced apart from the substrate 100. In other words, bottom surfaces CT1b of the first contact plugs CT1 (i.e., the bottoms RS1b of the first recess regions RS1) may be positioned at a higher level than the top surface of the substrate 100.

In contrast with the first contact plugs CT1, the second contact plugs CT2 may not extend through the second source/drain regions SD2. Bottom surfaces CT2b of the second contact plugs CT2 may be positioned at a level that is equal to or higher than the top surface 105t of the insulating layer 105. Accordingly, lower portions of the second contact plugs CT2 may be enclosed by the second source/drain regions SD2, respectively.

The first and second contact plugs CT1 and CT2 may be formed of or include conductive metal nitrides and/or metals. For example, the first and second contact plugs CT1 and CT2 may include metal nitrides (e.g., TiN, WN and TaN) and/or metals (e.g., Ti, W, and Ta).

The conductive metal nitrides and/or the metals for the first contact plugs CT1 may exert a tensile strain on the first channel region CH1. In particular, since the first contact plugs CT1 are vertically extended to a level lower than the lowermost one of the first semiconductor patterns NS1, it is possible to reduce a vertical variation in or increase a uniformity of stress exerted on the first semiconductor patterns NS1. This may make it possible to improve mobility of carriers to be generated in the first channel region CH1 when the first transistor TR1 is operated.

According to some embodiments of the inventive concepts, the bottom surfaces CT1b of the first contact plugs CT1 connected to the first transistor TR1 may be positioned at a level different from those of the bottom surfaces CT2b of the second contact plugs CT2 connected to the second transistor TR2. For example, the bottom surfaces CT1b of the first contact plugs CT1 may be deeper than the bottom surfaces CT2b of the second contact plugs CT2, and thus, it is possible to more effectively increase influence of the first contact plugs CT1 on the first channel region CH1, compared with that of the second contact plugs CT2 on the second channel region CH2. This may make it possible to exert a tensile strain on the first channel region CH1 of the first transistor TR1 and a compressive strain on the second channel region CH2 of the second transistor TR2. As a result, it is possible to improve mobility of carriers, when the first and second transistors TR1 and TR2 are operated.

FIGS. 2A, 3A, 4A, 5A, 6A, 7A, 8A, 9A, and 10A are plan views illustrating methods of fabricating a semiconductor device, according to some embodiments of the inventive concepts. FIGS. 2B, 3B, 4B, 5B, 6B, 7B, 8B, 9B, and 10B are sectional views taken along lines A-A' and B-B' of FIGS. 2A, 3A, 4A, 5A, 6A, 7A, 8A, 9A, and 10A, respectively. FIGS. 3C, 4C, 5C, 6C, 7C, 8C, 9C, and 10C are sectional views taken along lines C-C' and D-D' of FIGS. 3A, 4A, 5A, 6A, 7A, 8A, 9A, and 10A, respectively.

Figure 2A:
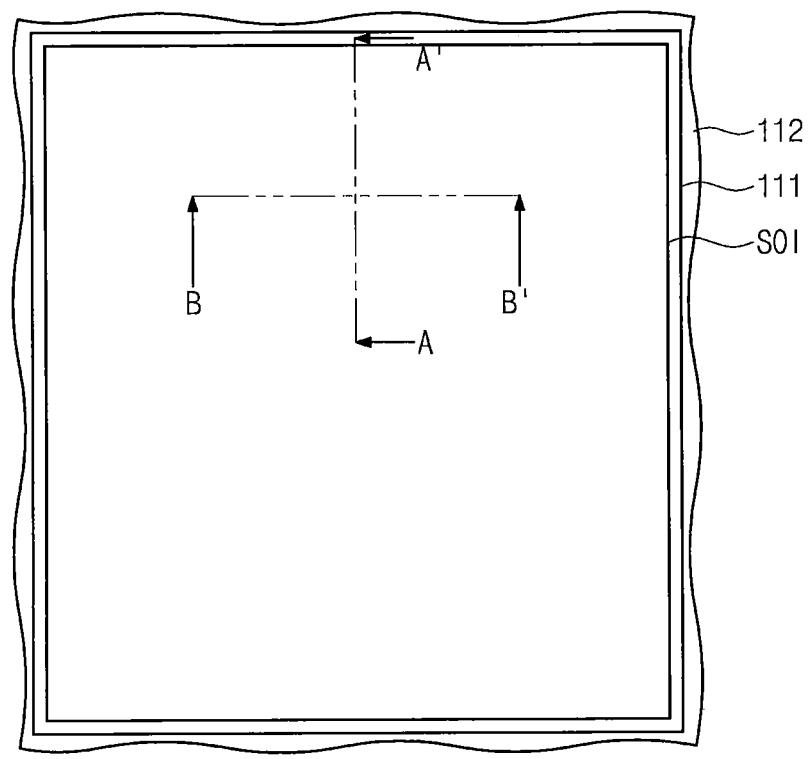
FIGS. 2A, 3A, 4A, 5A, 6A, 7A, 8A, 9A, and 10A are plan views illustrating methods of fabricating a semiconductor device, according to some embodiments of the inventive concepts.
Figure 2A:
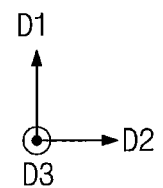

Referring to FIGS. 2A and 2B, an SOI substrate may be provided. The SOI substrate may include a substrate 100 serving as a handling substrate, a first semiconductor layer 107, and an insulating layer 105 interposed between the substrate 100 and the first semiconductor layer 107. Sacrificial layers 111 and second semiconductor layers 112 may be alternatingly and repeatedly stacked on the SOI substrate. Although three sacrificial layers 111 and two second semiconductor layers 112 between the sacrificial layers 111 are illustrated, the inventive concepts may not be limited thereto.

The sacrificial layers 111 may include a material having an etch selectivity with respect to the first semiconductor layer 107 and the second semiconductor layers 112. For example, when the sacrificial layers 111 are etched in a subsequent process, materials for the sacrificial layers 111 and the first and second semiconductor layers 107 and 112 may be selected to selectively remove the sacrificial layers 111 and to suppress the first and second semiconductor layers 107 and 112 from being etched. The etch selectivity may be quantitatively expressed by a ratio in etch rate of the first and second semiconductor layers 107 and 112 to the sacrificial layers 111. As an example, the sacrificial layers 111 may be formed of a material having an etch selectivity of 1:10 to 1:200 with respect to the first and second semiconductor layers 107 and 112. In some embodiments, the sacrificial layers 111 may be formed of or include one of SiGe, Si, and Ge, and the first and second semiconductor layers 107 and 112 may be formed of or include another of SiGe, Si, and Ge. For example, the first semiconductor layer 107 and the second semiconductor layers 112 may include Si, and the sacrificial layers 111 may include SiGe.

The sacrificial layers 111 and the second semiconductor layers 112 may be formed by an epitaxial growth process using the first semiconductor layer 107 as a seed layer. As an example, the epitaxial growth process may be performed using a chemical vapor deposition (CVD) process or a molecular beam epitaxy (MBE) process. The sacrificial layers 111 and the second semiconductor layers 112 may be consecutively formed in the same chamber. The sacrificial layers 111 and the second semiconductor layers 112 may not be locally formed on the first semiconductor layer 107 and may be formed to conformally extend on or cover the resulting structure provided with the first semiconductor layer 107. The sacrificial layers 111 and the second semiconductor layers 112 may be formed to have substantially the same thickness, but the inventive concepts may not be limited thereto.

Figure 3A:
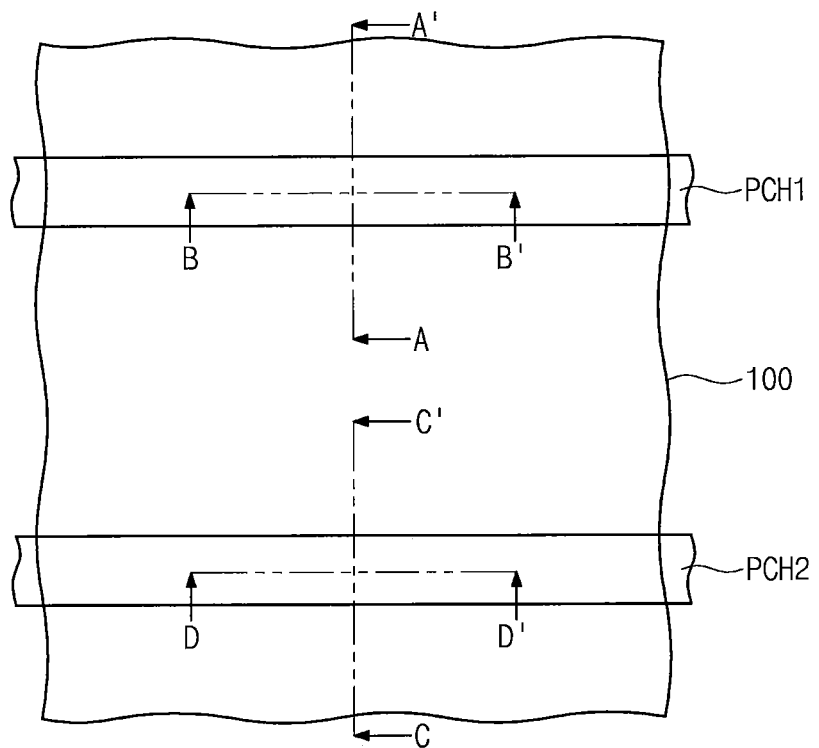
Figure 3B:
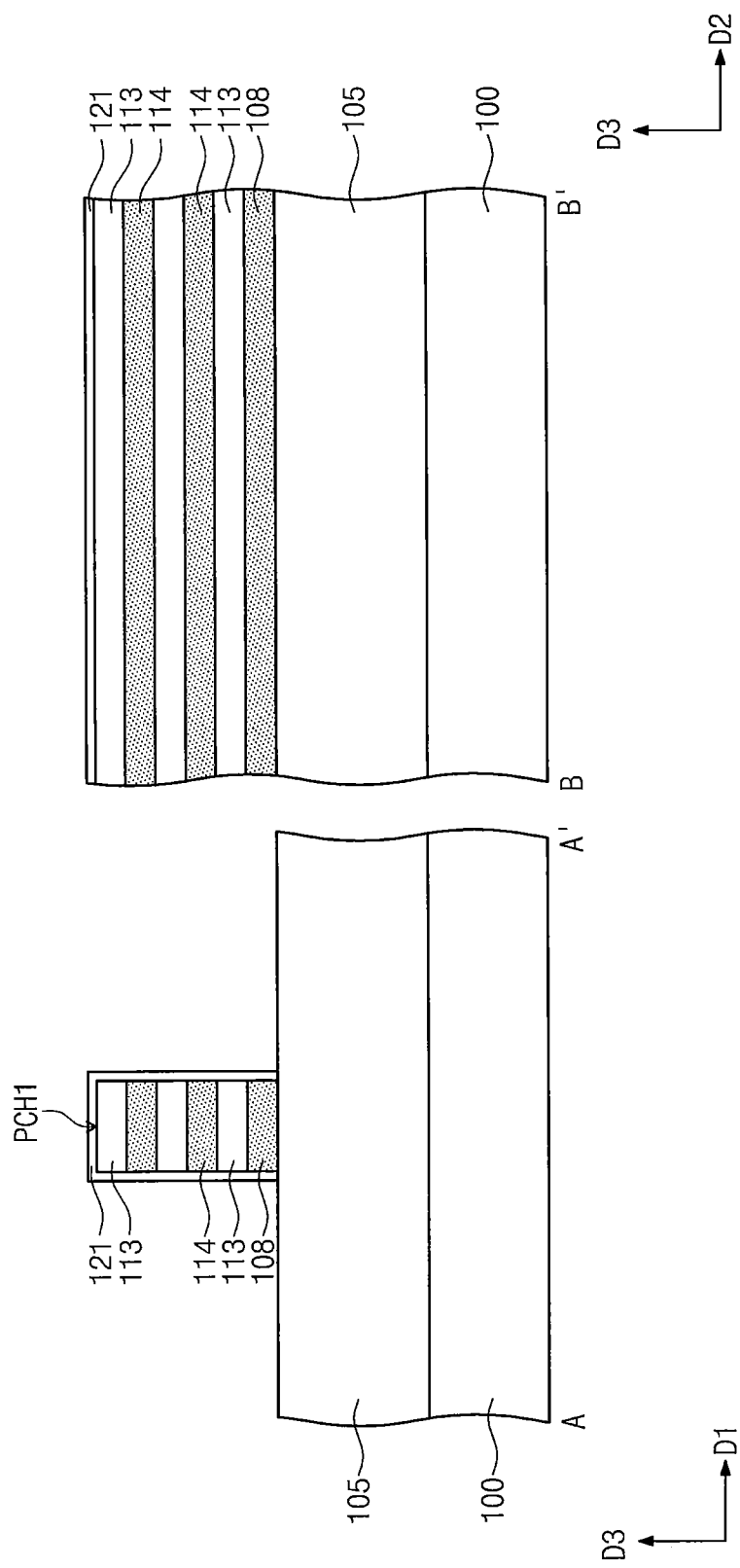
Figure 3C:
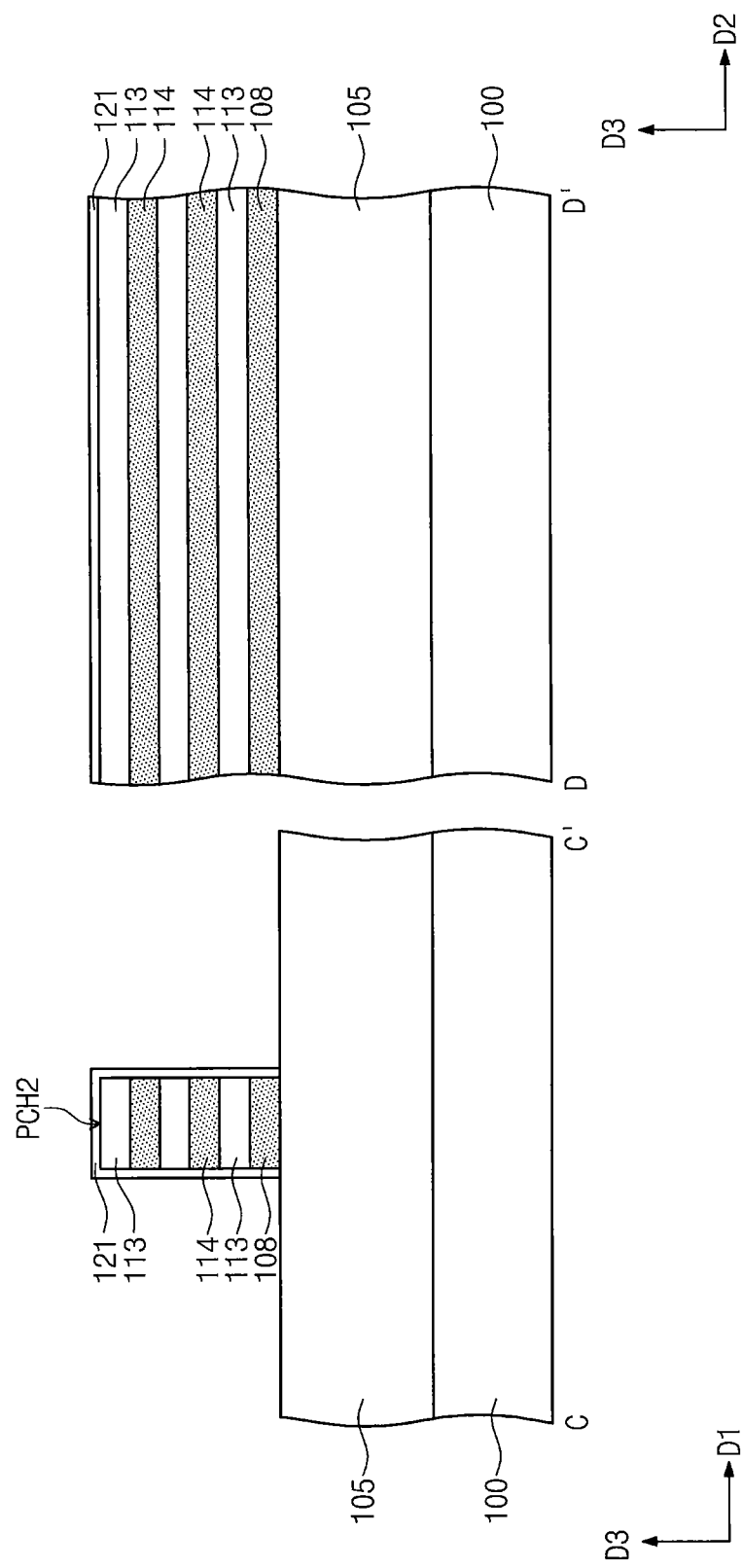
FIGS. 3C, 4C, 5C, 6C, 7C, 8C, 9C, and 10C are sectional views taken along lines C-C' and D-D' of FIGS. 3A, 4A, 5A, 6A, 7A, 8A, 9A, and 10A, respectively.

Referring to FIGS. 3A to 3C, the sacrificial layers 111 and the first and second semiconductor layers 107 and 112 may be patterned to form a first preliminary channel region PCH1 and a second preliminary channel region PCH2. The first and second preliminary channel regions PCH1 and PCH2 may be formed to have a line- or bar-shaped structure extending in a second direction D2.

For example, the sacrificial layers 111 may be patterned to form preliminary sacrificial patterns 113. The first semiconductor layer 107 may be patterned to form first patterns 108. The second semiconductor layers 112 may be patterned to form second patterns 114. Thus, each of the first and second preliminary channel regions PCH1 and PCH2 may include the first pattern 108, the preliminary sacrificial patterns 113, and the second patterns 114. The patterning process may include an anisotropic dry etching process using a first mask pattern.

After the patterning process, capping insulating layers 121 may be formed on the first and second preliminary channel regions PCH1 and PCH2, respectively. The capping insulating layers 121 may be formed by a thermal oxidation process. As an example, the capping insulating layers 121 may be formed of or include silicon-germanium oxide. In certain embodiments, the capping insulating layers 121 may be formed by a deposition process.

Figure 4A:
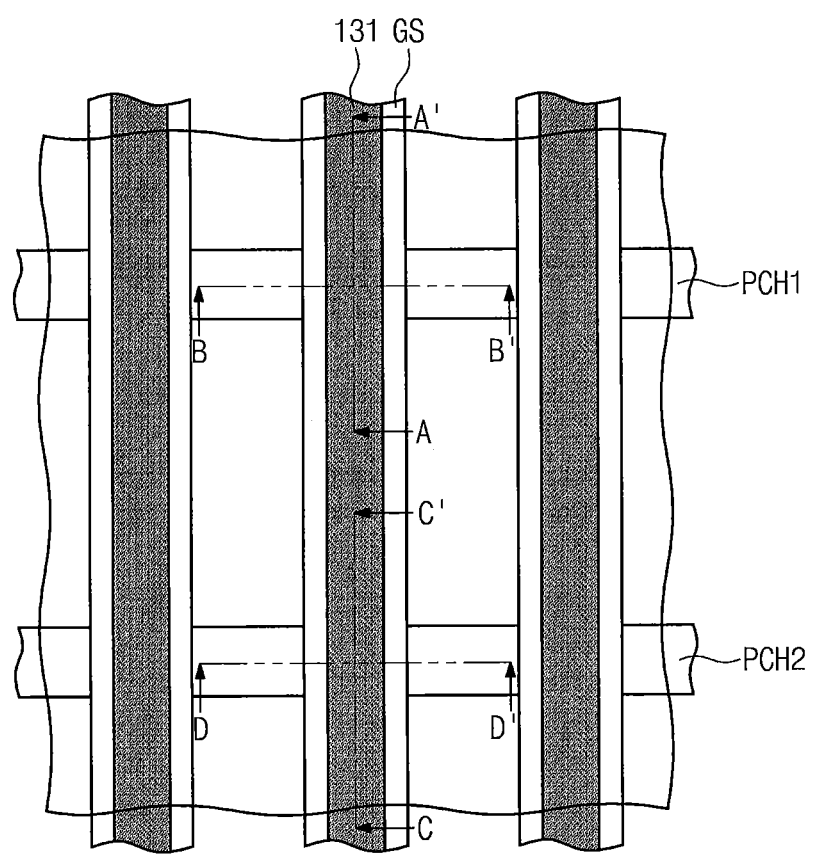
Figure 4A:
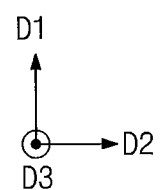
Figure 4B:
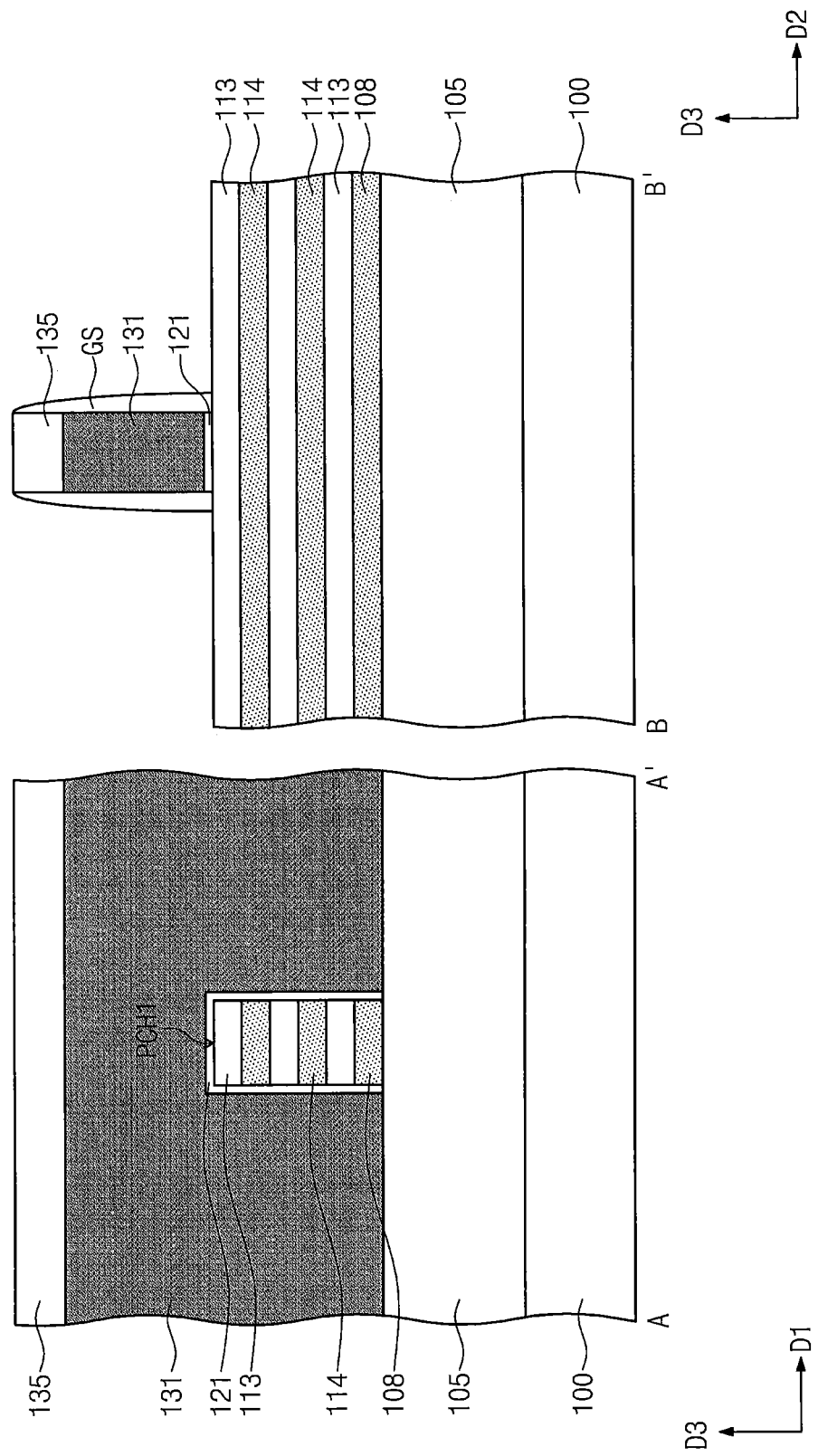
Figure 4C:
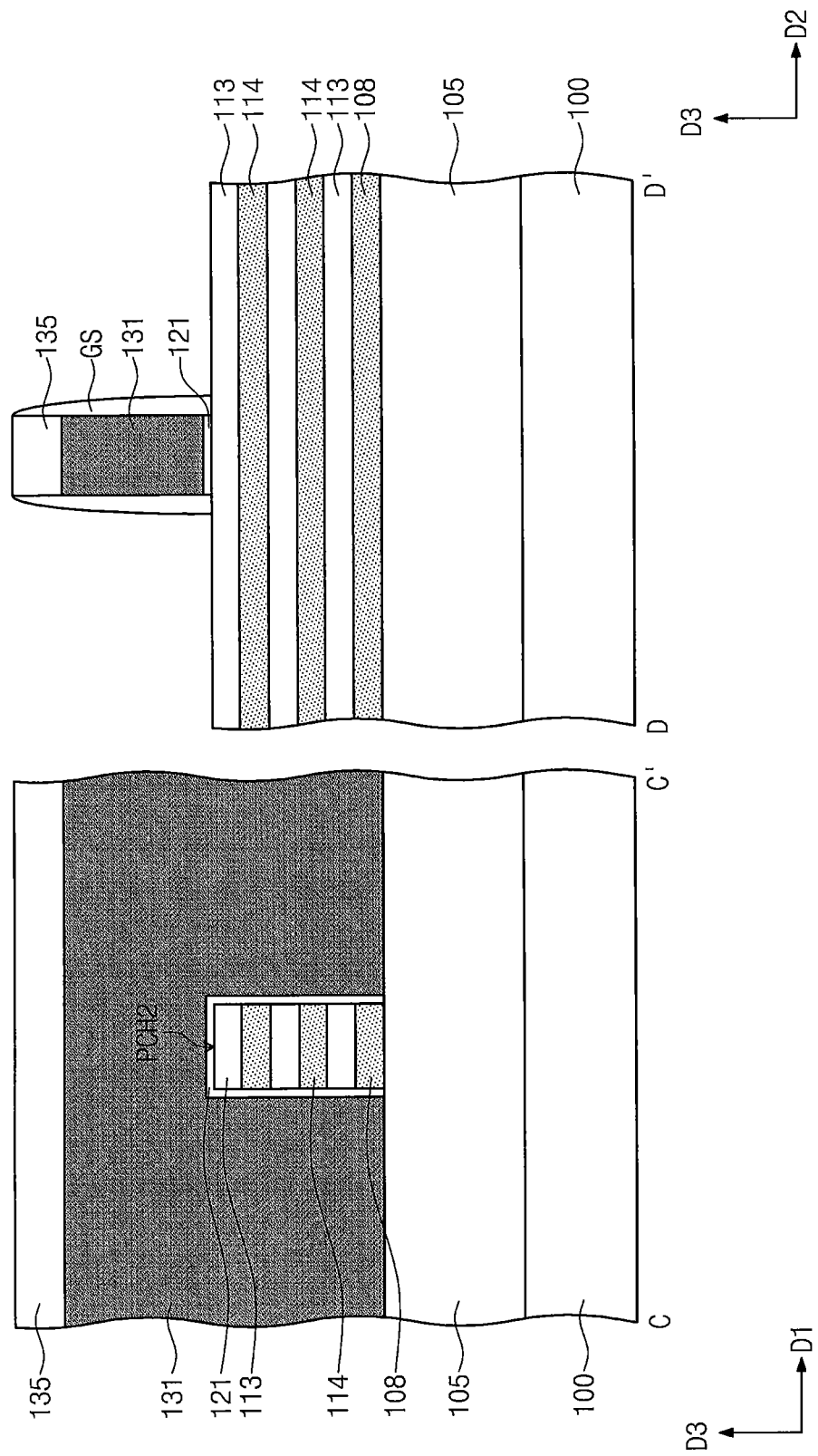

Referring to FIGS. 4A to 4C, dummy gates 131 may be formed to cross the first and second preliminary channel regions PCH1 and PCH2. The dummy gates 131 may be formed to have a line- or bar-shaped structure extending in a first direction D1.

Gate mask patterns 135 may be provided on the dummy gates 131. The formation of the dummy gates 131 and the gate mask patterns 135 may include sequentially forming a dummy gate layer and a gate mask layer on the substrate 100 and sequentially patterning the dummy gate layer and the gate mask layer. The dummy gate layer may be formed of or include a polysilicon layer. The gate mask layer may be formed of or include a silicon nitride layer or a silicon oxynitride layer. In certain embodiments, a portion of the capping insulating layers 121 may be etched when the dummy gate layer and the gate mask layer are patterned.

Gate spacers GS may be respectively formed on side surfaces of the dummy gates 131. The gate spacers GS may be formed of or include a silicon oxide layer, a silicon nitride layer, and/or a silicon oxynitride layer. The formation of the gate spacers GS may include forming a spacer layer using a deposition process (e.g., CVD or ALD) and performing an anisotropic etching process on the spacer layer.

Figure 5A:
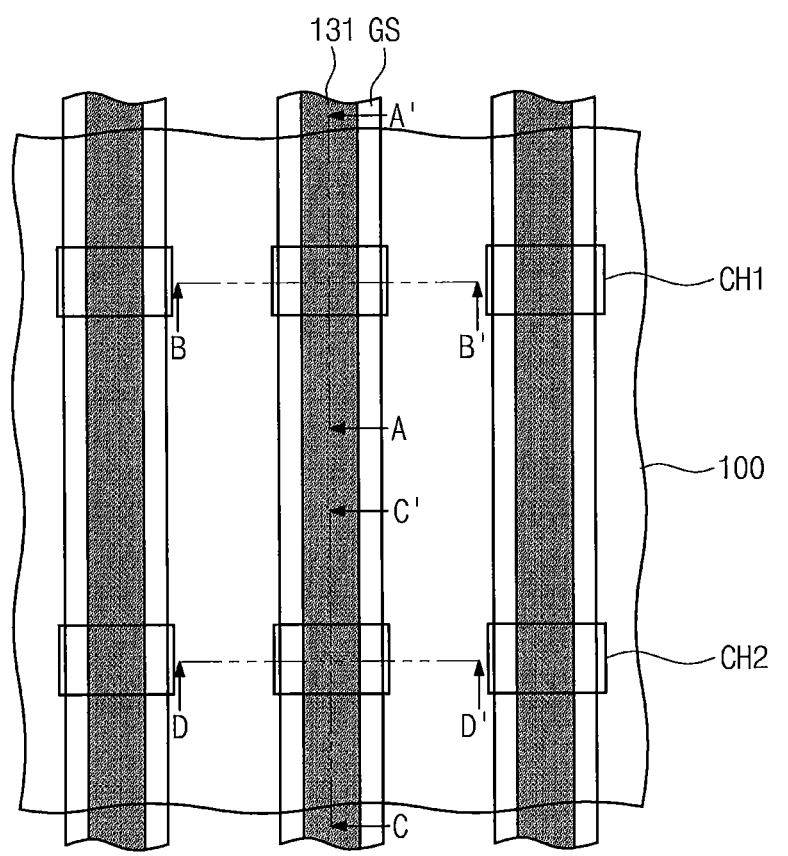
Figure 5A:
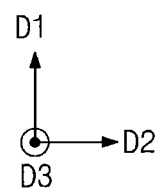
Figure 5B:
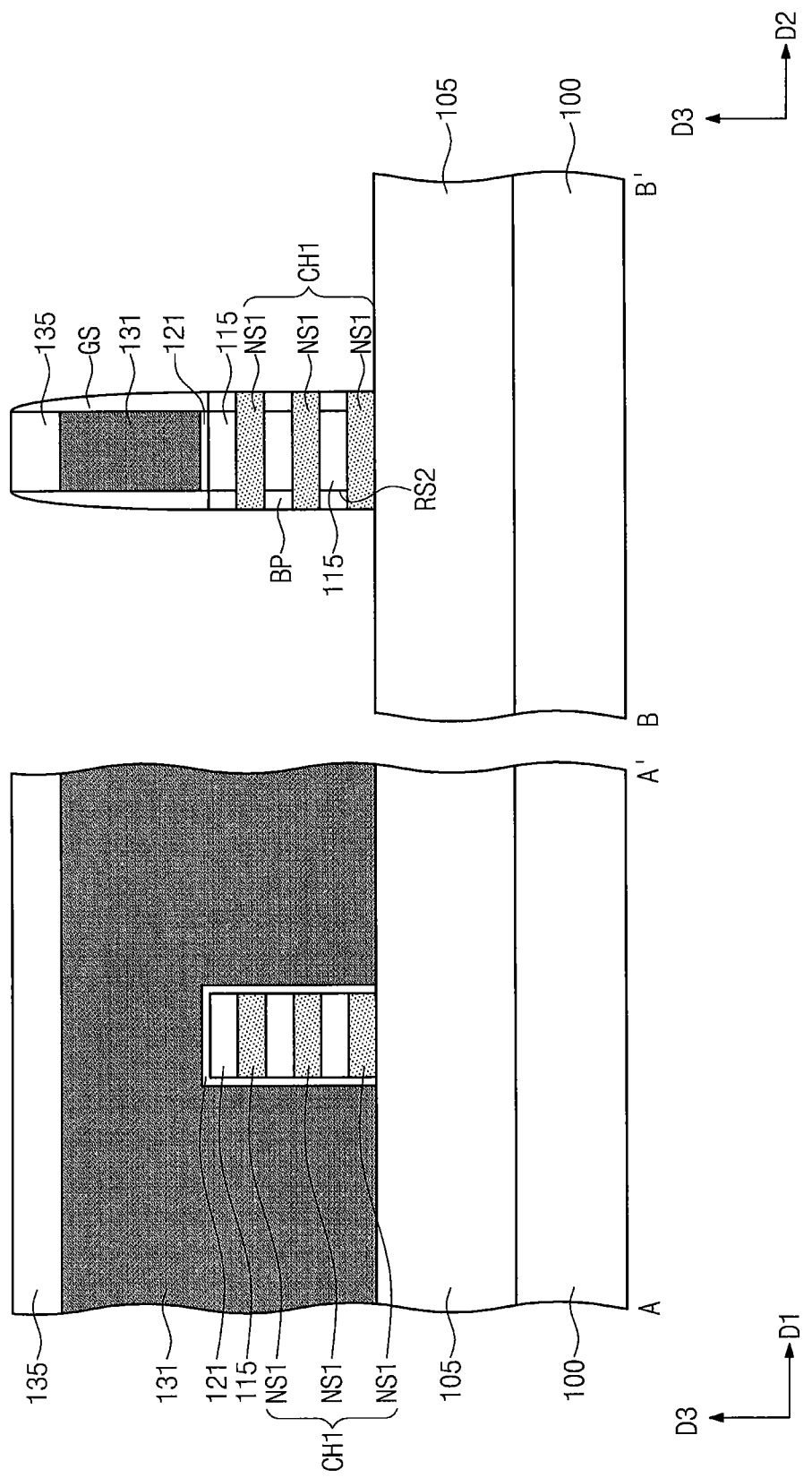
Figure 5C:
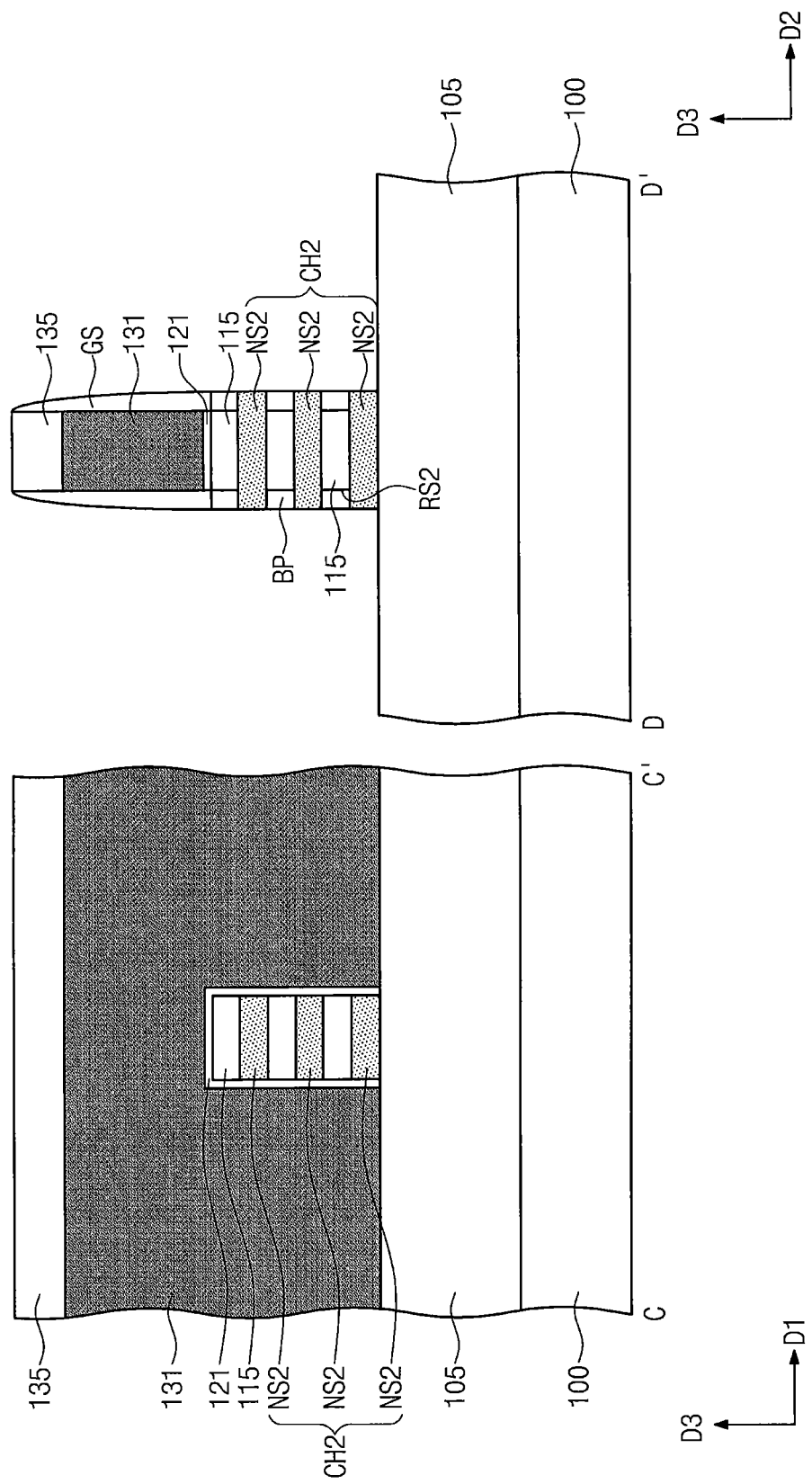

Referring to FIGS. 5A to 5C, the first and second preliminary channel regions PCH1 and PCH2 may be patterned using the gate mask patterns 135 and the gate spacers GS as an etch mask to form first and second channel regions CH1 and CH2, respectively. The first channel regions CH1 may be arranged in the second direction D2, and the second channel regions CH2 may be arranged in the second direction D2.

In detail, the preliminary sacrificial patterns 113 of the first preliminary channel region PCH1 may be patterned to form sacrificial patterns 115. The first and second patterns 108 and 114 of the first preliminary channel region PCH1 may be patterned to form first semiconductor patterns NS1. The preliminary sacrificial patterns 113 of the second preliminary channel region PCH2 may be patterned to form the sacrificial patterns 115. The first and second patterns 108 and 114 of the second preliminary channel region PCH2 may be patterned to form second semiconductor patterns NS2. The first semiconductor patterns NS1 may constitute or define the first channel region CH1, and the second semiconductor patterns NS2 may constitute or define the second channel region CH2.

Thereafter, the sacrificial patterns 115 may be laterally and partially etched to form second recess regions RS2. The formation of the second recess regions RS2 may include an etching step using an etchant which can selectively etch the sacrificial patterns 115. For example, in the case where the first and second semiconductor patterns NS1 and NS2 include silicon and the sacrificial patterns 115 include silicon germanium, the formation of the second recess regions RS2 may include an etching step using an etching solution including peracetic acid.

Barrier insulating patterns BP may be formed to fill the second recess regions RS2, respectively. The barrier insulating patterns BP may be vertically spaced apart from each other with the first semiconductor patterns NS1 interposed therebetween. Also, the barrier insulating patterns BP may be vertically spaced apart from each other with the second semiconductor patterns NS2 interposed therebetween. The formation of the barrier insulating patterns BP may include conformally forming a barrier insulating layer on the second recess regions RS2 and performing an anisotropic etching process on the barrier insulating layer. In some embodiments, the barrier insulating patterns BP may be formed of or include a silicon oxide layer, a silicon nitride layer, and/or a silicon oxynitride layer.

Figure 6A:
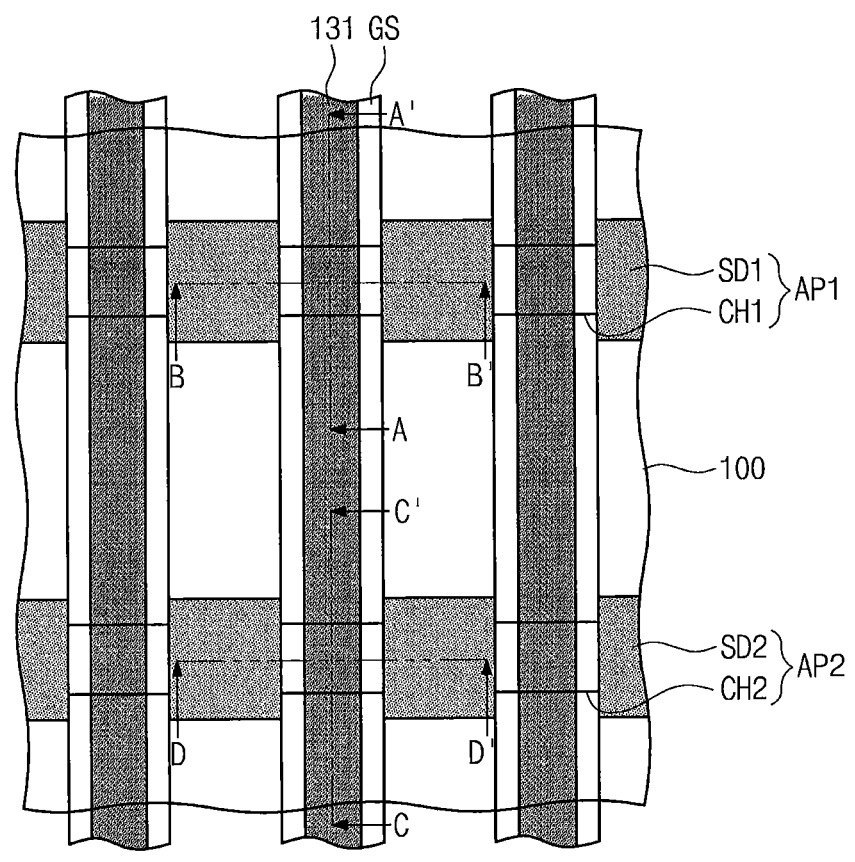
Figure 6B:
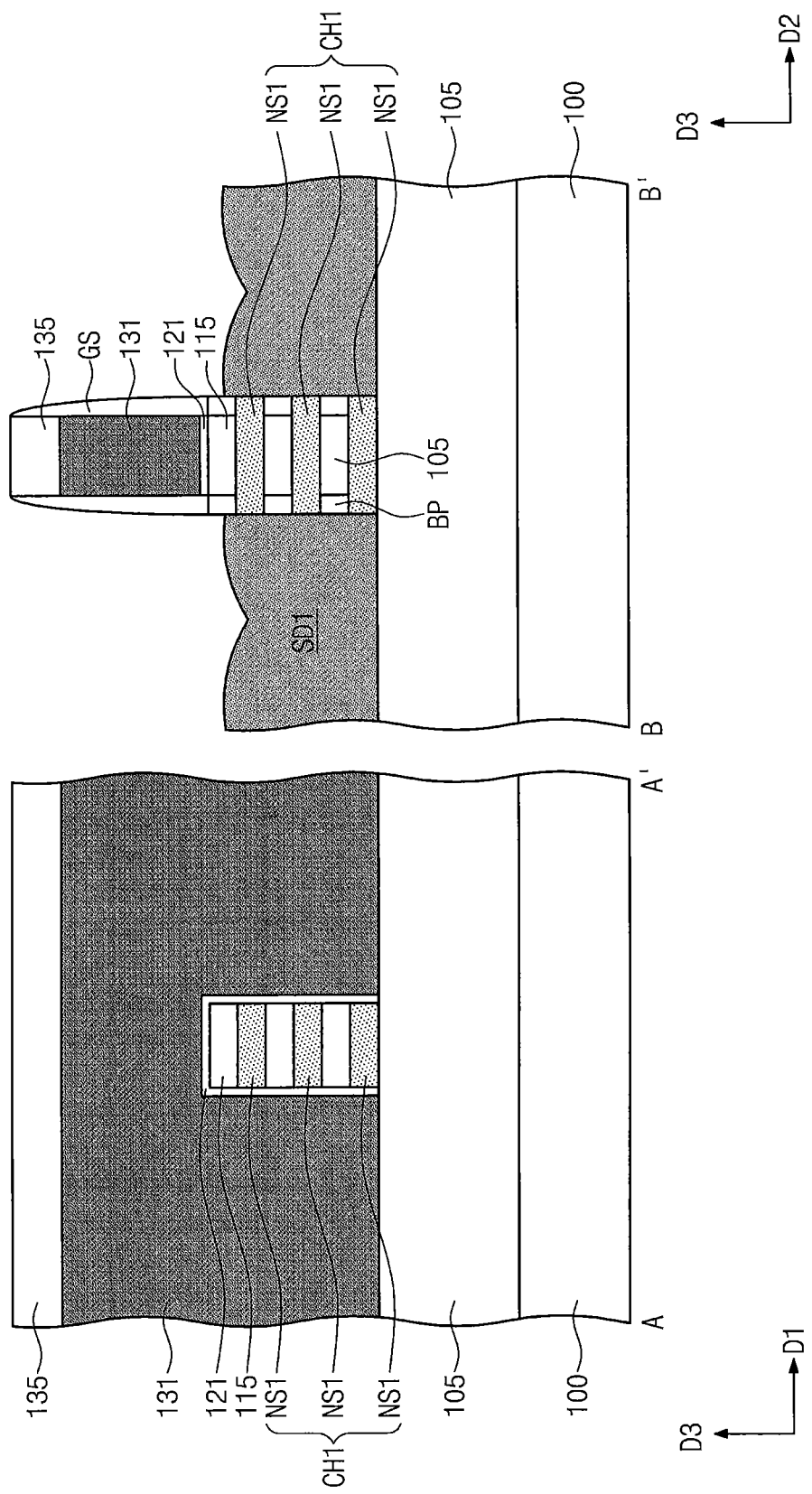
Figure 6C:
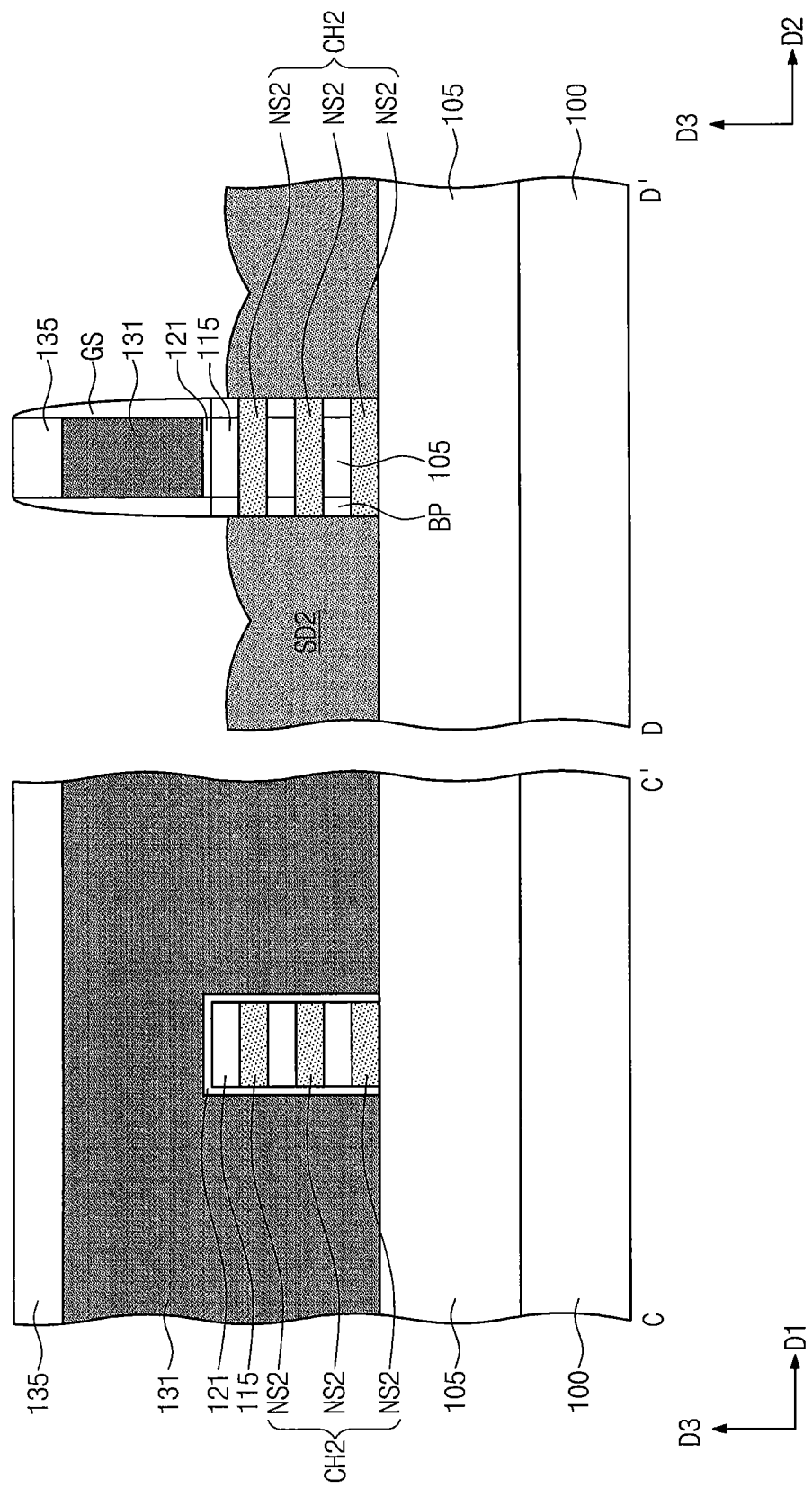

Referring to FIGS. 6A to 6C, source/drain regions SD1 and SD2 may be formed at both sides of each of the dummy gates 131. For example, the first source/drain regions SD1 may be formed by a selective epitaxial process using the first semiconductor patterns NS1 as a seed layer. The second source/drain regions SD2 may be formed by a selective epitaxial process using the second semiconductor patterns NS2 as a seed layer.

As an example, the first source/drain regions SD1, which are respectively grown from a pair of the first channel regions CH1 adjacent to each other in the second direction D2, may be merged to fill a space between the pair of the first channel regions CH1. The second source/drain regions SD2, which are respectively grown from a pair of the second channel regions CH2 adjacent to each other in the second direction D2, may be merged to fill a space between the pair of the second channel regions CH2.

The first channel regions CH1 and the first source/drain regions SD1 may be connected to each other to constitute or define a first active region AP1 extending in the second direction D2. The second channel regions CH2 and the second source/drain regions SD2 may be connected to each other to constitute or define a second active region AP2 extending in the second direction D2.

The first source/drain regions SD1 and the second source/drain regions SD2 may be formed through different processes. In this case, the first source/drain regions SD1 may be formed of a semiconductor material different from that of the second source/drain regions SD2. Also, the first source/drain regions SD1 may be doped to have a conductivity type different from that of the second source/drain regions SD2. For example, the first source/drain regions SD1 may be selectively formed by using a second mask pattern covering the second channel regions CH2. Thereafter, the second mask pattern may be removed, and then, a third mask pattern may be formed to extend on or cover the first source/drain regions SD1. The second source/drain regions SD2 may be selectively formed by using the third mask pattern.

The first source/drain regions SD1 may be formed of a semiconductor material capable of exerting a tensile strain on the first channel region CH1. As an example, the first source/drain regions SD1 may be formed of a SiC layer, whose lattice constant is smaller than that of Si, or a Si layer, whose lattice constant is substantially the same as that of the substrate 100. During or after the selective epitaxial process, the first source/drain regions SD1 may be doped to have an n-type conductivity.

The second source/drain regions SD2 may include a material capable of exerting a compressive strain on the second channel region CH2. As an example, the second source/drain regions SD2 may be formed of a SiGe layer, whose lattice constant is larger than that of a Si layer. During or after the selective epitaxial process, the second source/drain regions SD2 may be doped to have a p-type conductivity.

Figure 7A:
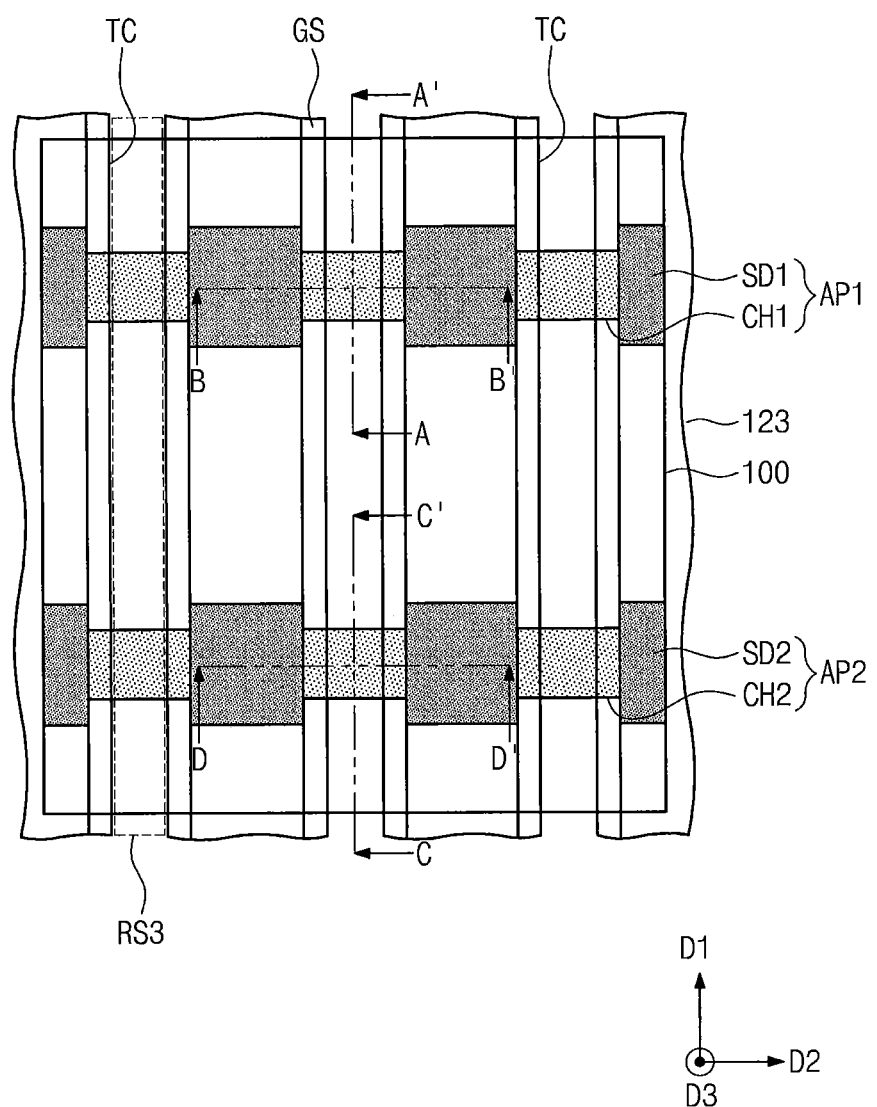
Figure 7B:
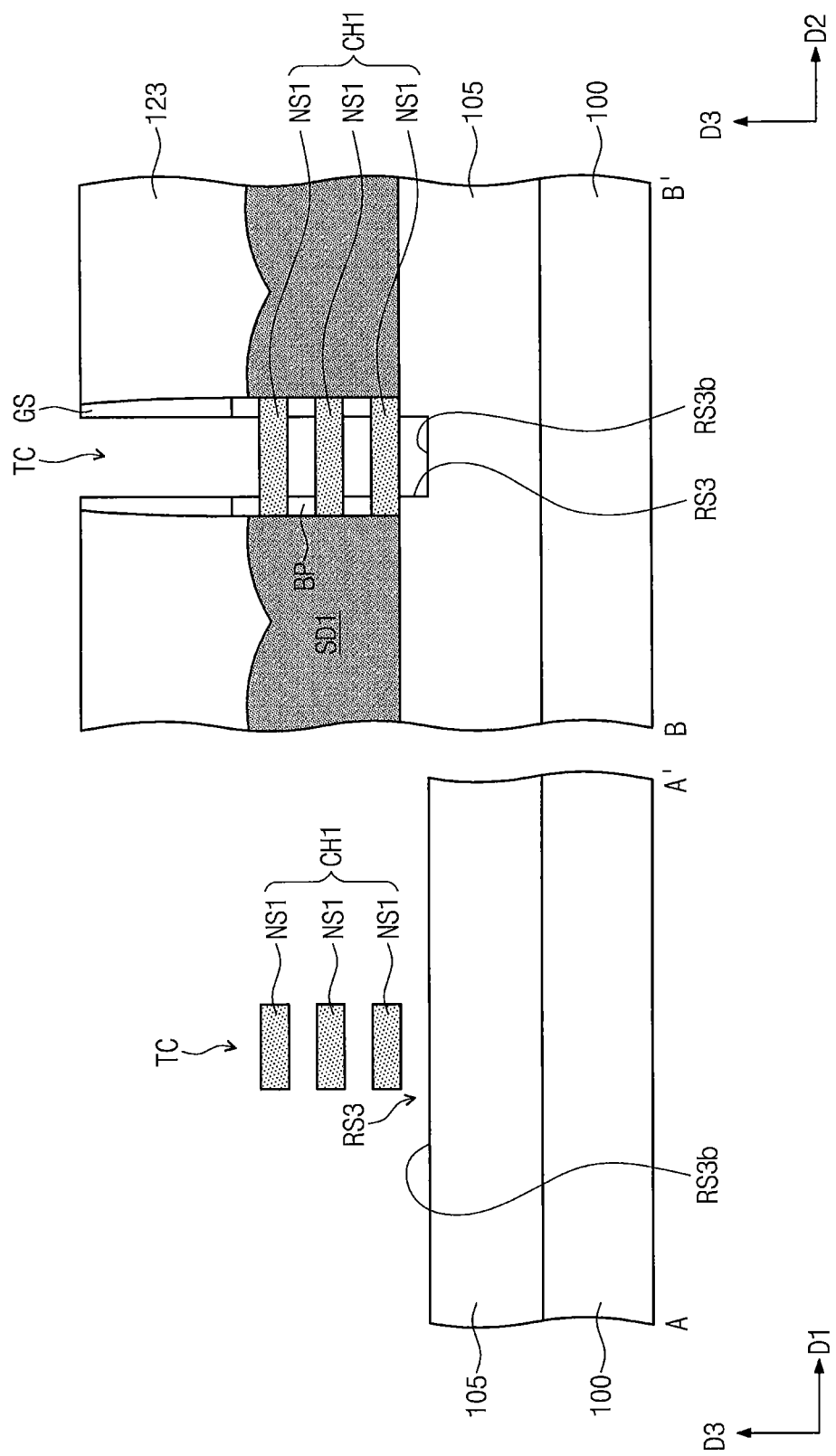
Figure 7C:
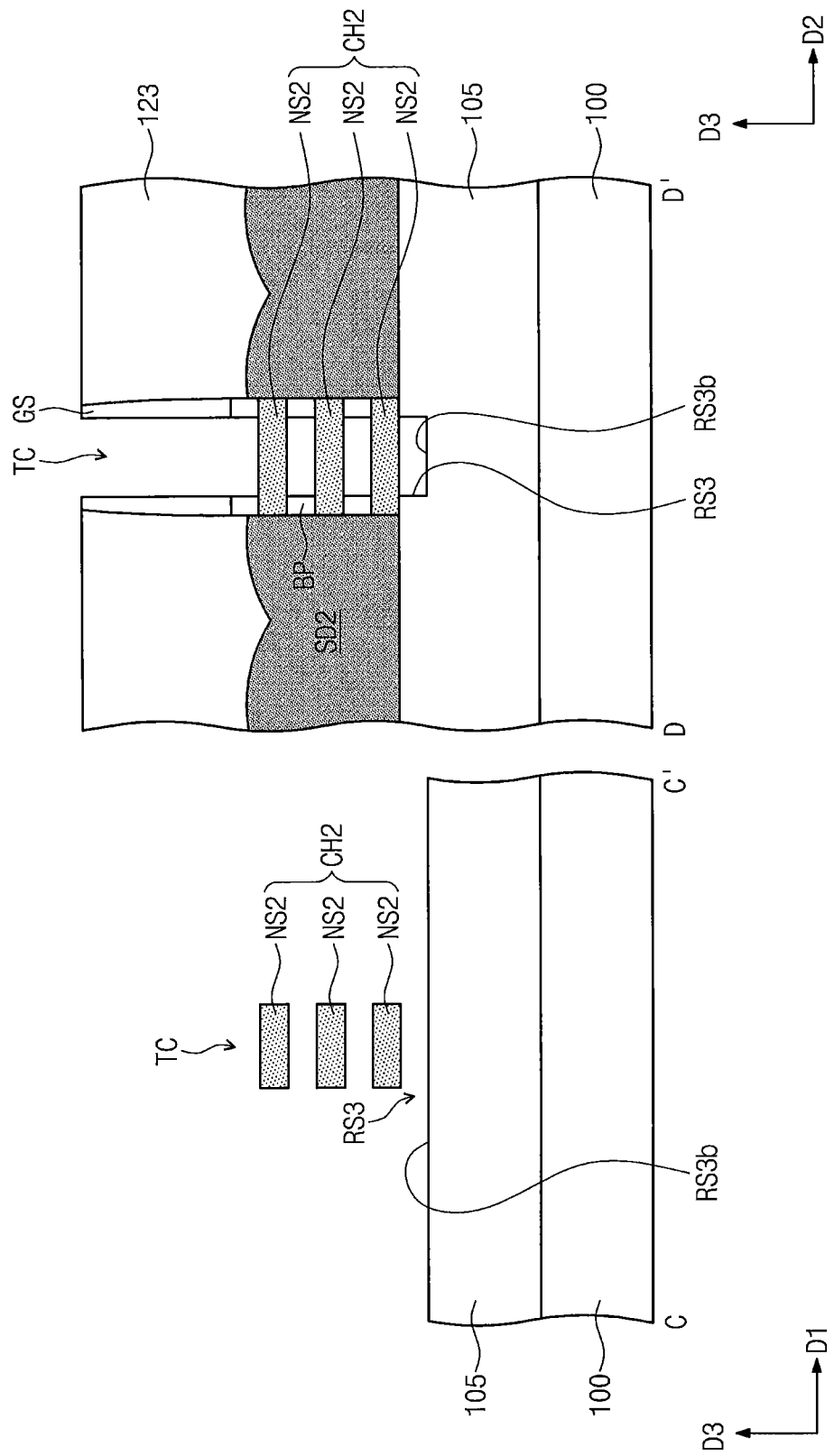

Referring to FIGS. 7A to 7C, an interlayered insulating layer 123 may be formed on the substrate 100. Thereafter, a planarization process may be performed on the interlayered insulating layer 123 to expose the top surfaces of the dummy gates 131. The planarization process may include an etch-back process and/or a chemical mechanical polishing (CMP) process. The gate mask patterns 135 may be removed during the planarization process. The interlayered insulating layer 123 may be formed of or include a silicon oxide layer or a silicon oxynitride layer.

The dummy gates 131 exposed by the planarization process may be selectively removed. The capping insulating layers 121 may be removed by the process for removing the dummy gates 131 or by an additional process. As a result of the removal of the dummy gates 131, the first channel regions CH1 and the second channel regions CH2 may be exposed. Also, as a result of the removal of the dummy gates 131, the sacrificial patterns 115 may be exposed.

The sacrificial patterns 115 may be selectively removed. In the case where the sacrificial patterns 115 include silicon germanium and the first and second semiconductor patterns NS1 and NS2 include silicon, the selective etching process may be performed using an etching solution containing peracetic acid. The etching solution may further contain hydrofluoric acid (HF) solution and deionized water. Since the first and second source/drain regions SD1 and SD2 are covered with the barrier insulating patterns BP and the interlayered insulating layer 123, they may be protected from the etching solution.

The dummy gates 131 and the sacrificial patterns 115 may be removed to form trenches TC. Each of the trenches TC may be defined by the first and second semiconductor patterns NS1 and NS2, the gate spacers GS, and the barrier insulating patterns BP. When viewed in a plan view, the trenches TC may extend in the first direction D1.

Next, an upper portion of the insulating layer 105 exposed by the trenches TC may be etched to form third recess regions RS3. The formation of the third recess regions RS3 may include etching the insulating layer 105 in a selective and isotropic manner. Each of the third recess regions RS3 may be formed to extend parallel to a corresponding one of the trenches TC and in the first direction D1. The third recess regions RS3 may be connected to the trenches TC, respectively.

Each of the third recess regions RS3 may be formed between the lowermost one of the first semiconductor pattern NS1 and the insulating layer 105. Also, each of the third recess regions RS3 may be formed between the lowermost one of the second semiconductor pattern NS2 and the insulating layer 105. Since the third recess regions RS3 are formed by etching the upper portion of the insulating layer 105, bottoms RS3b of the third recess regions RS3 may be positioned at a lower level than the top surface 105t of the insulating layer 105.

Figure 8A:
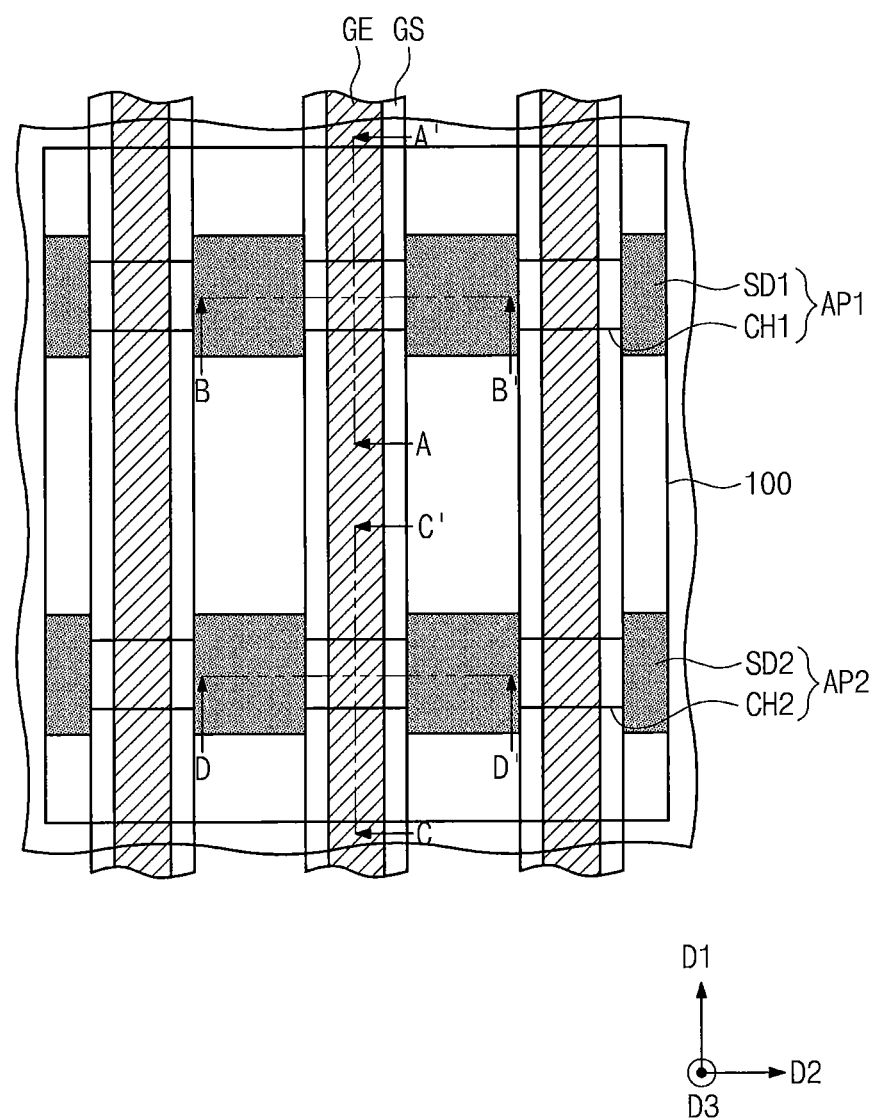
Figure 8B:
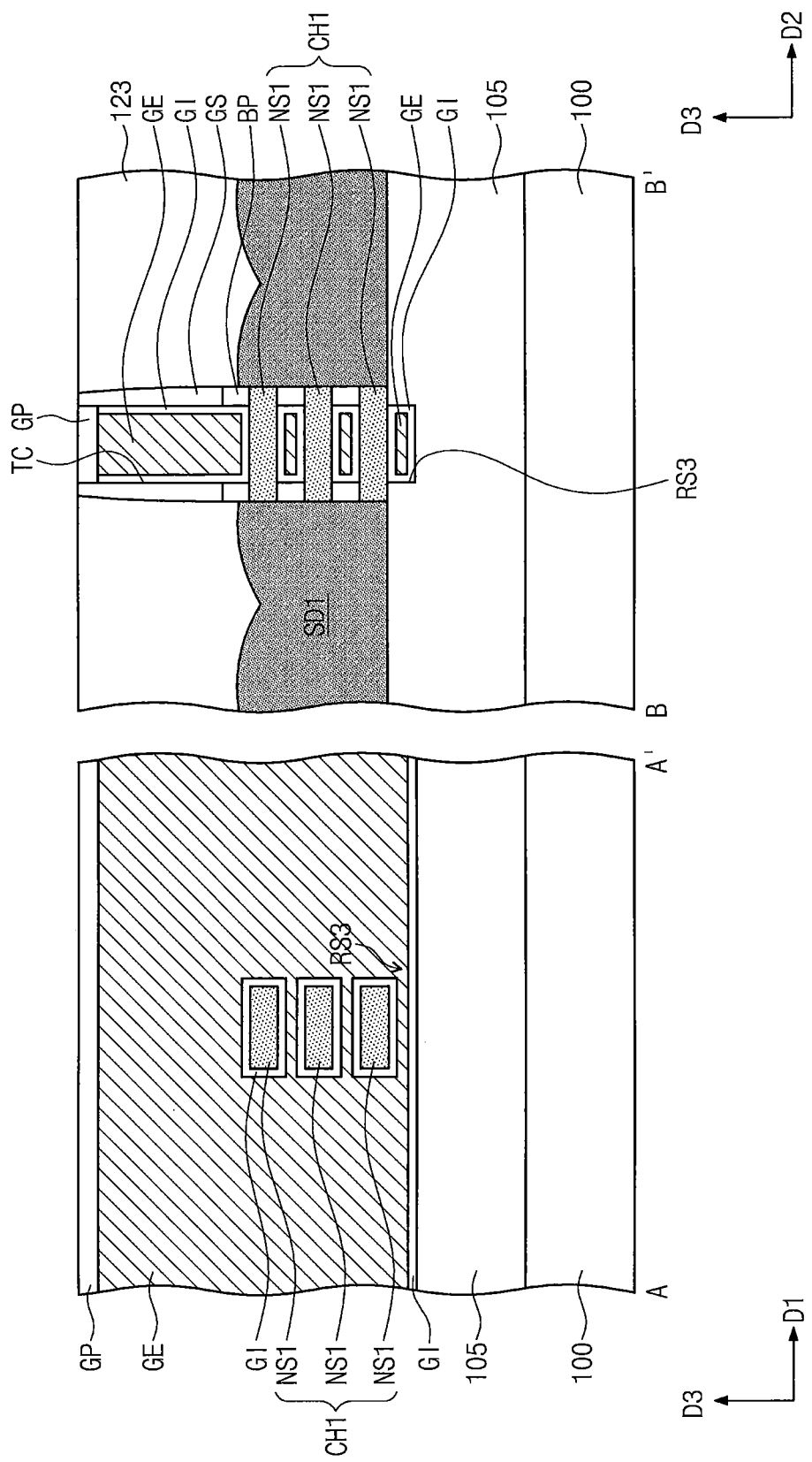
Figure 8C:
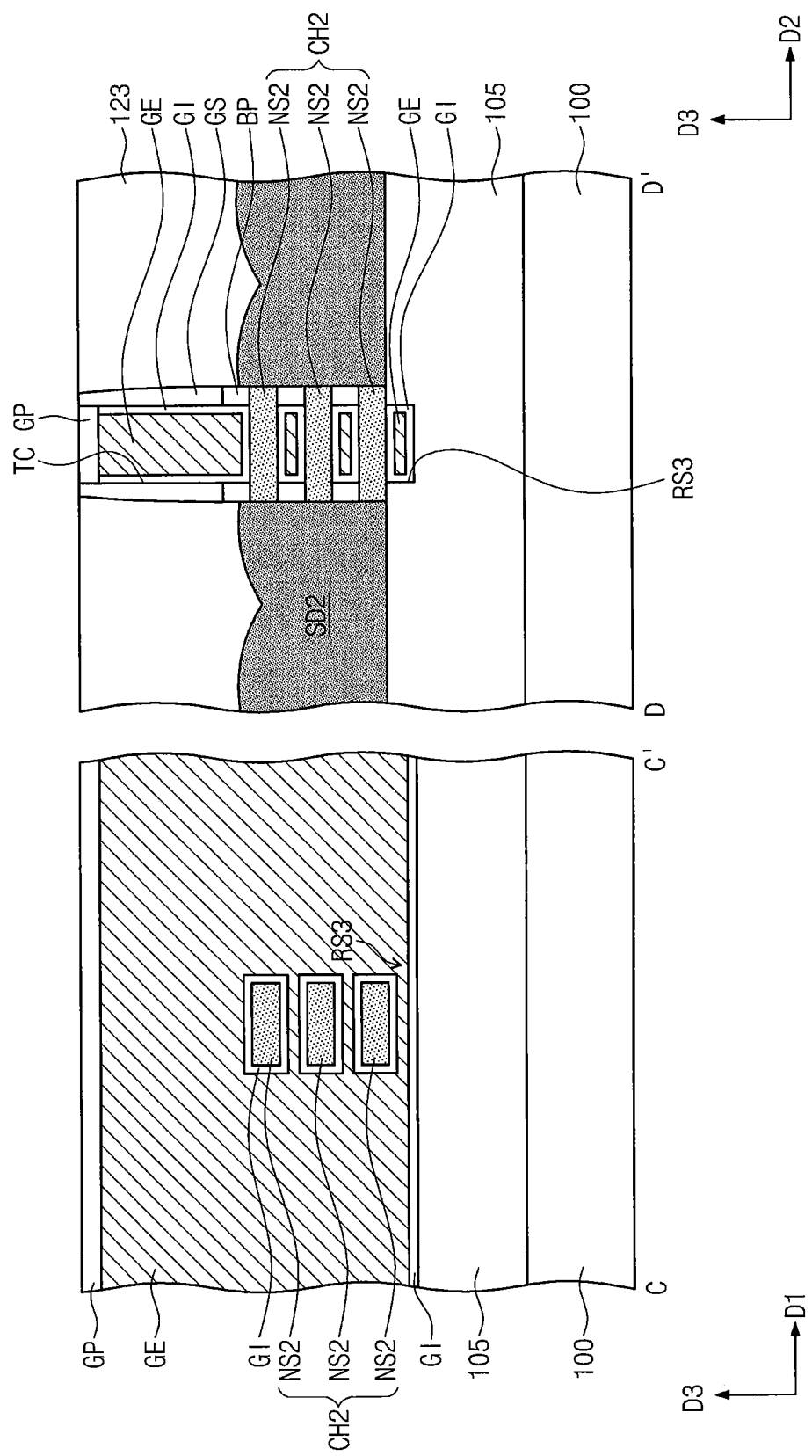

Referring to FIGS. 8A to 8C, a gate insulating pattern GI and a gate electrode GE may be formed in each of the trenches TC and each of the third recess regions RS3. In detail, the formation of the gate insulating pattern GI and the gate electrode GE may include sequentially forming a gate insulating layer and a gate conductive layer in the trenches TC and the third recess regions RS3 and performing a planarization process.

In some embodiments, the gate insulating layer may be formed of or include a silicon oxide layer, a silicon oxynitride layer, and/or high-k dielectric materials, whose dielectric constants are higher than that of the silicon oxide layer. The gate conductive layer may be formed of or include at least one of doped semiconductor materials, conductive metal nitrides, or metals.

The gate insulating pattern GI and the gate electrode GE may be formed to fill spaces between the first semiconductor patterns NS1. In addition, the gate insulating pattern GI may be formed to fill a space (e.g., the third recess region RS3) between the lowermost one of the first semiconductor pattern NS1 and the insulating layer 105. Similarly, the gate insulating pattern GI and the gate electrode GE may be formed to fill spaces between the second semiconductor patterns NS2. Also, the gate insulating pattern GI may be formed to fill a space (e.g., the third recess region RS3) between the lowermost one of the second semiconductor pattern NS2 and the insulating layer 105. The gate electrode GE may be formed to be spaced apart from the first and second semiconductor patterns NS1 and NS2 with the gate insulating pattern GI interposed therebetween.

Next, upper portions of the gate insulating patterns GI and the gate electrodes GE may be recessed, and capping patterns GP may be formed in the recessed regions, respectively. The capping patterns GP may be formed of or include at least one of a silicon oxide layer, a silicon nitride layer, or a silicon oxynitride layer.

Figure 9A:
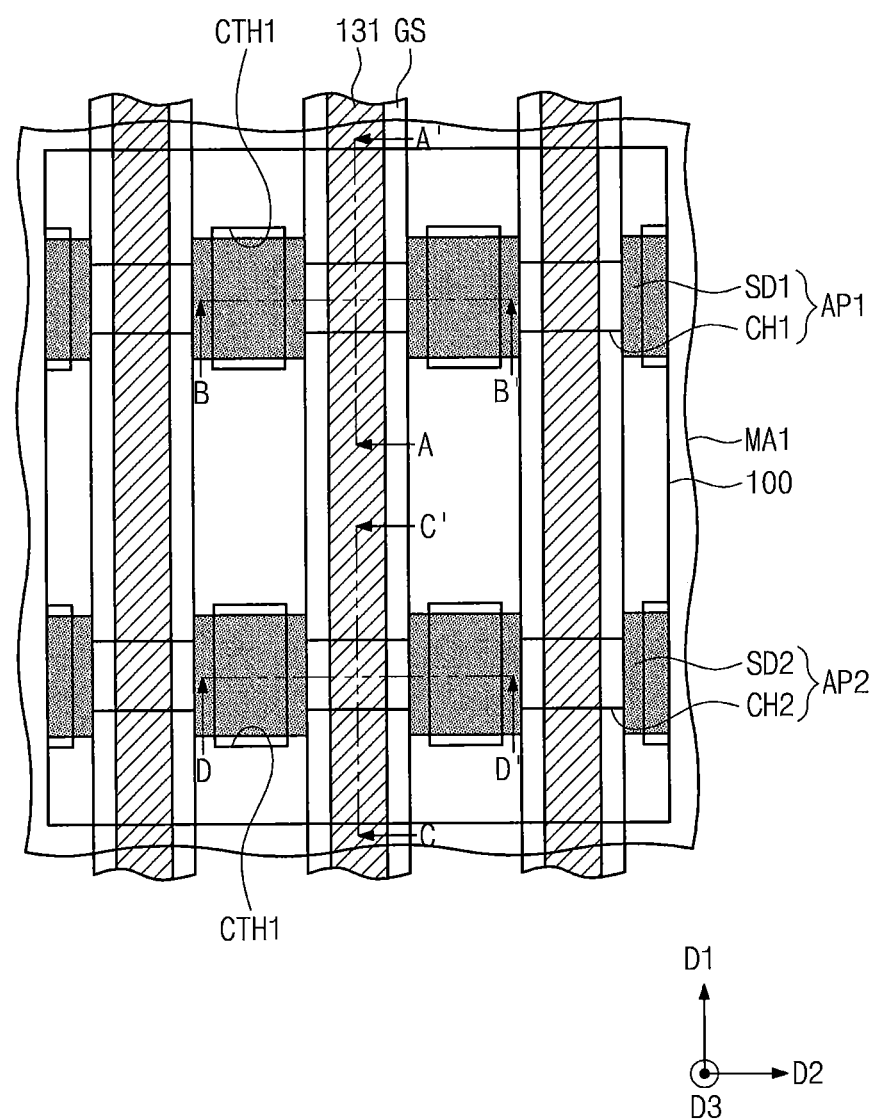
Figure 9B:
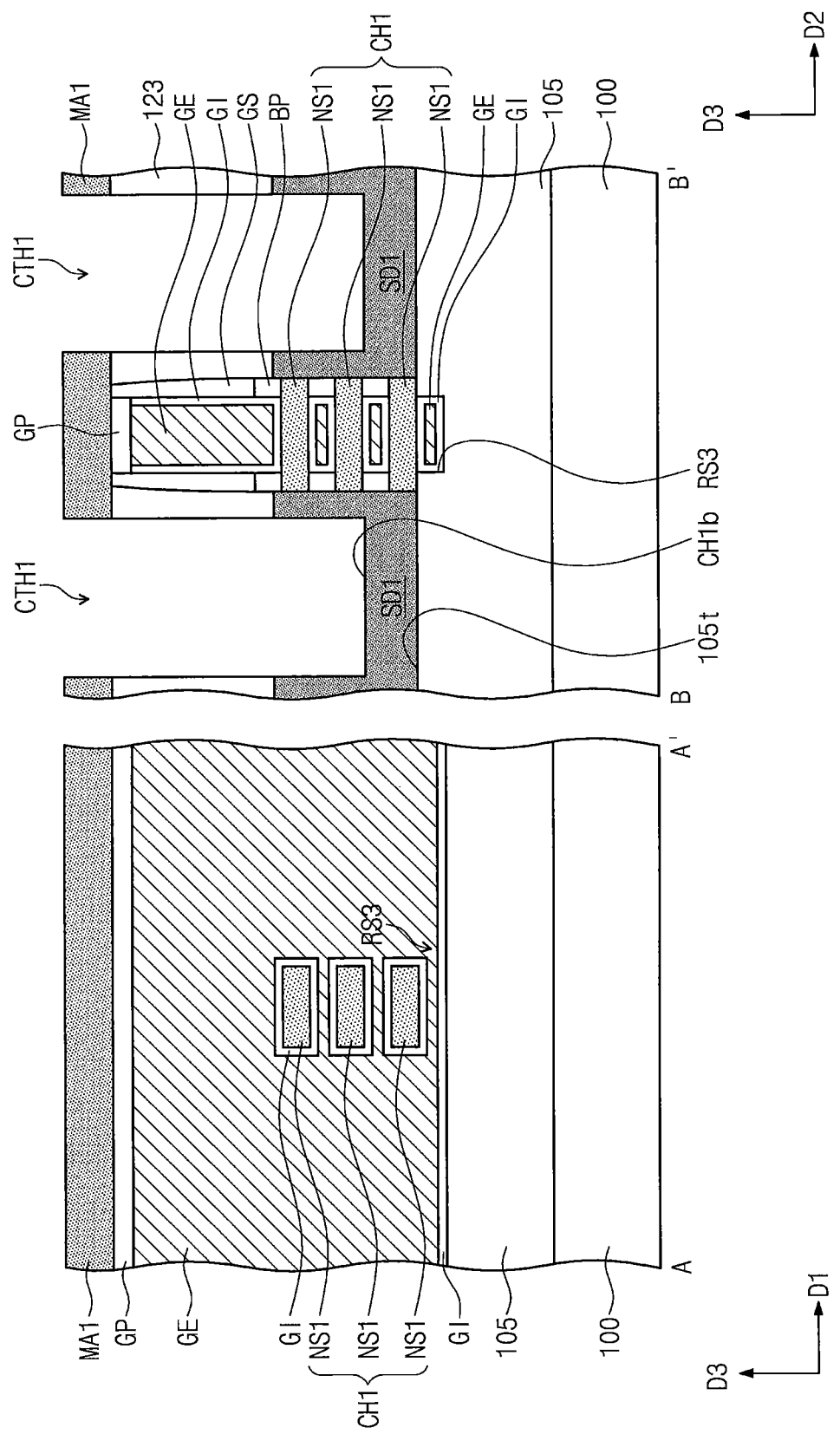
Figure 9C:
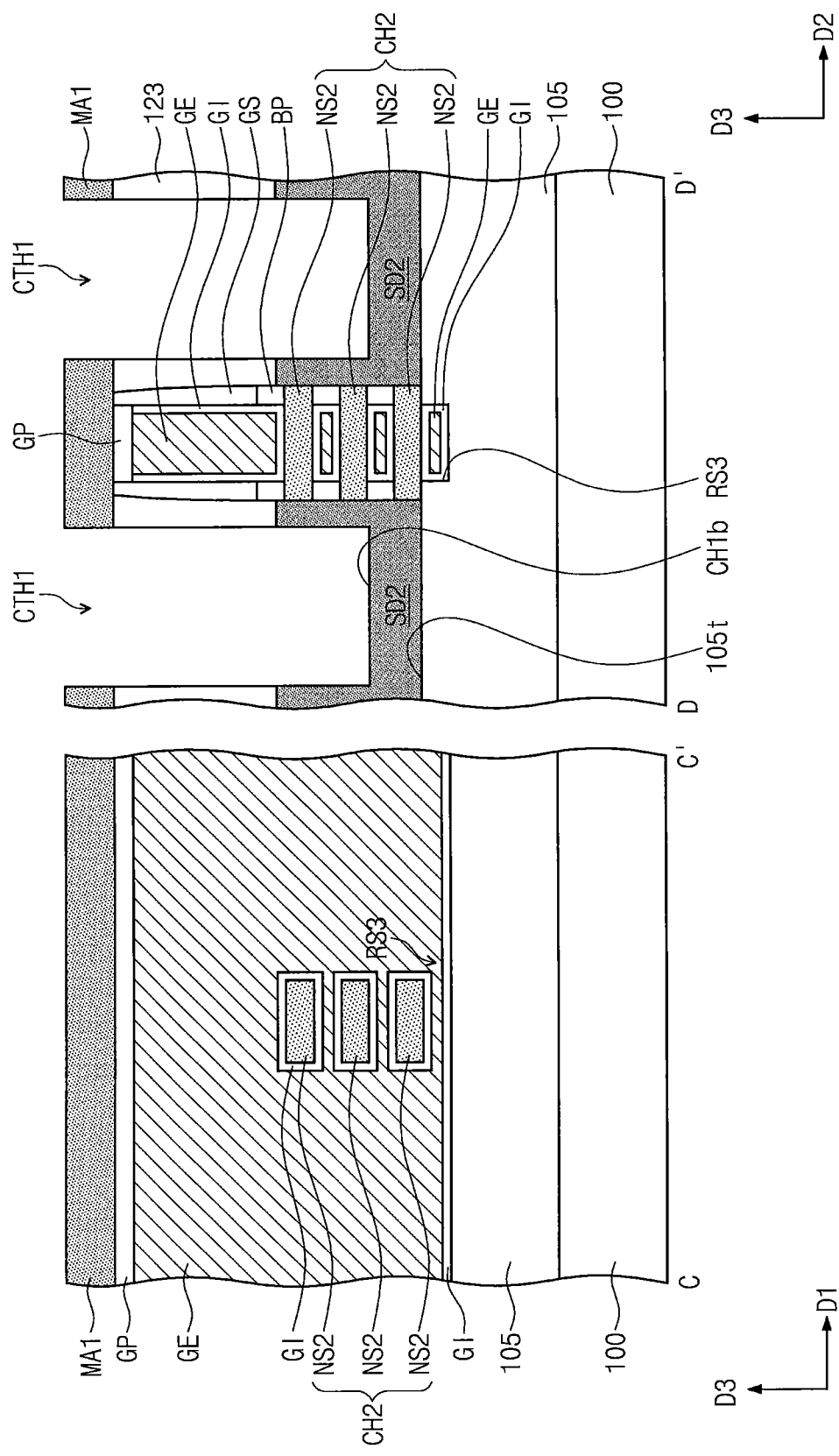

Referring to FIGS. 9A to 9C, a fourth mask pattern MA1 with openings may be formed on the interlayered insulating layer 123. When viewed in a plan view, the openings of the fourth mask pattern MA1 may be overlapped with the first and second source/drain regions SD1 and SD2. For example, the formation of the fourth mask pattern MA1 may include forming a first mask layer on the interlayered insulating layer 123 and patterning the first mask layer to form the fourth mask pattern MA1.

The interlayered insulating layer 123 and the first and second source/drain regions SD1 and SD2 may be sequentially etched using the fourth mask pattern MA1 as an etch mask to form first contact holes CTH1. The first contact holes CTH1 may not extend through the first and second source/drain regions SD1 and SD2 completely. In other words, bottoms CH1b of the first contact holes CTH1 may be positioned at a level that is higher than or equal to the top surface 105t of the insulating layer 105.

When viewed in a plan view, the first contact holes CTH1 may be formed between the gate electrodes GE. In addition, the first contact holes CTH1 may be formed to expose the first and second source/drain regions SD1 and SD2.

Figure 10A:
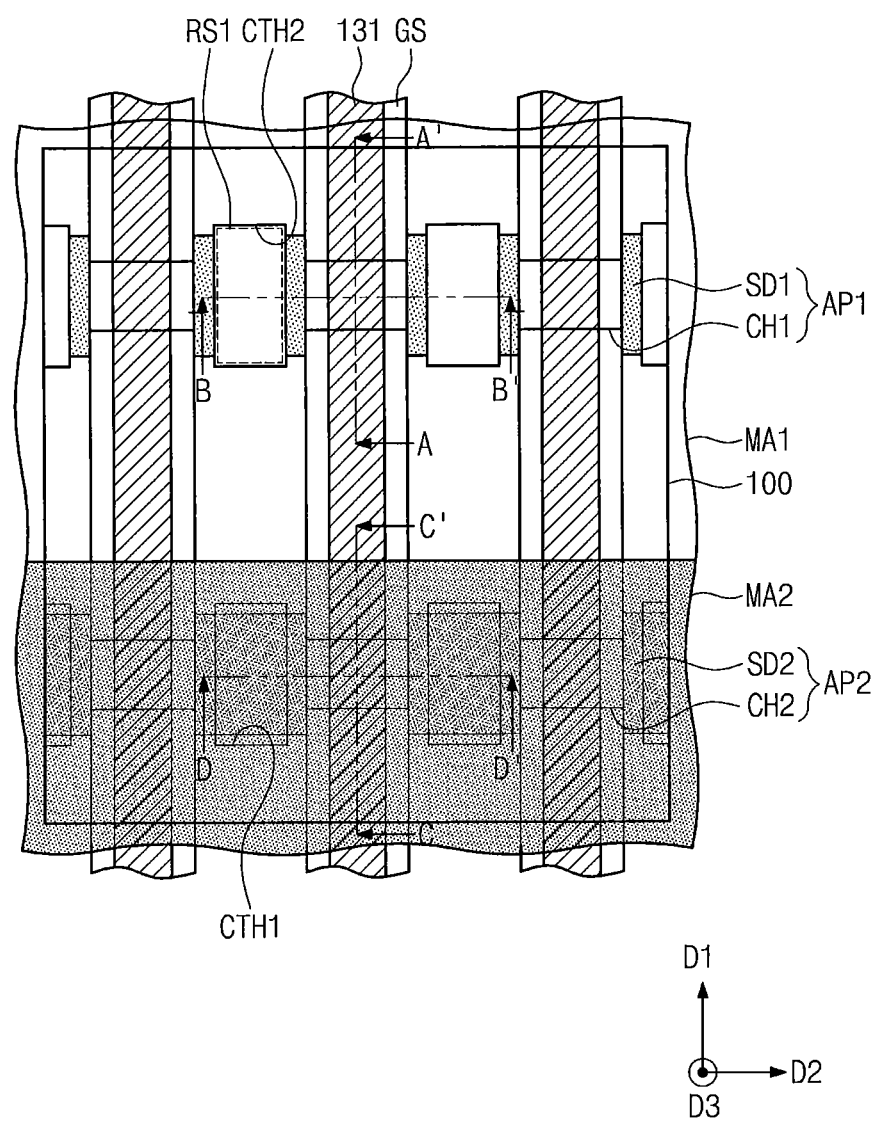
Figure 10B:
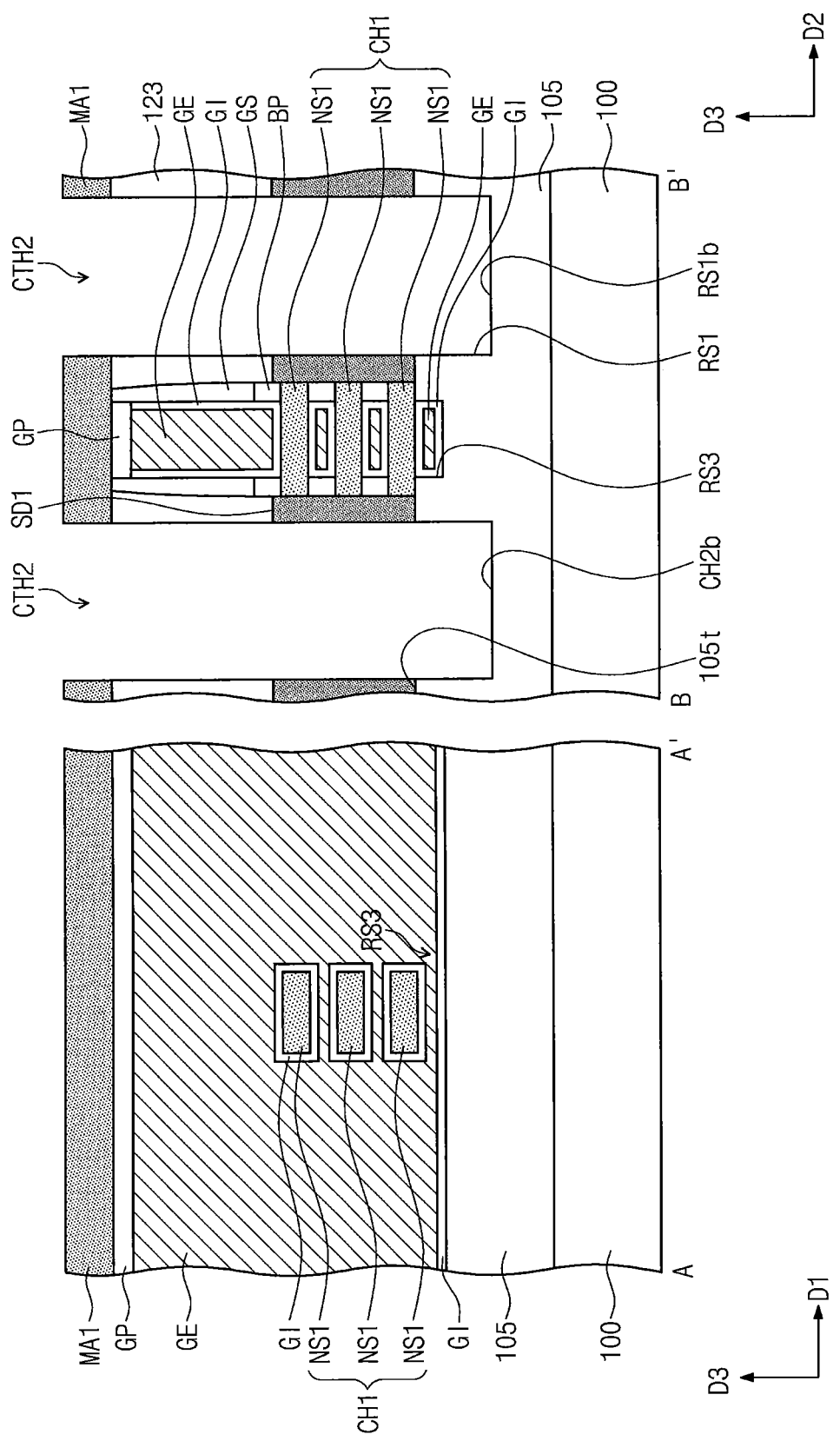
Figure 10C:
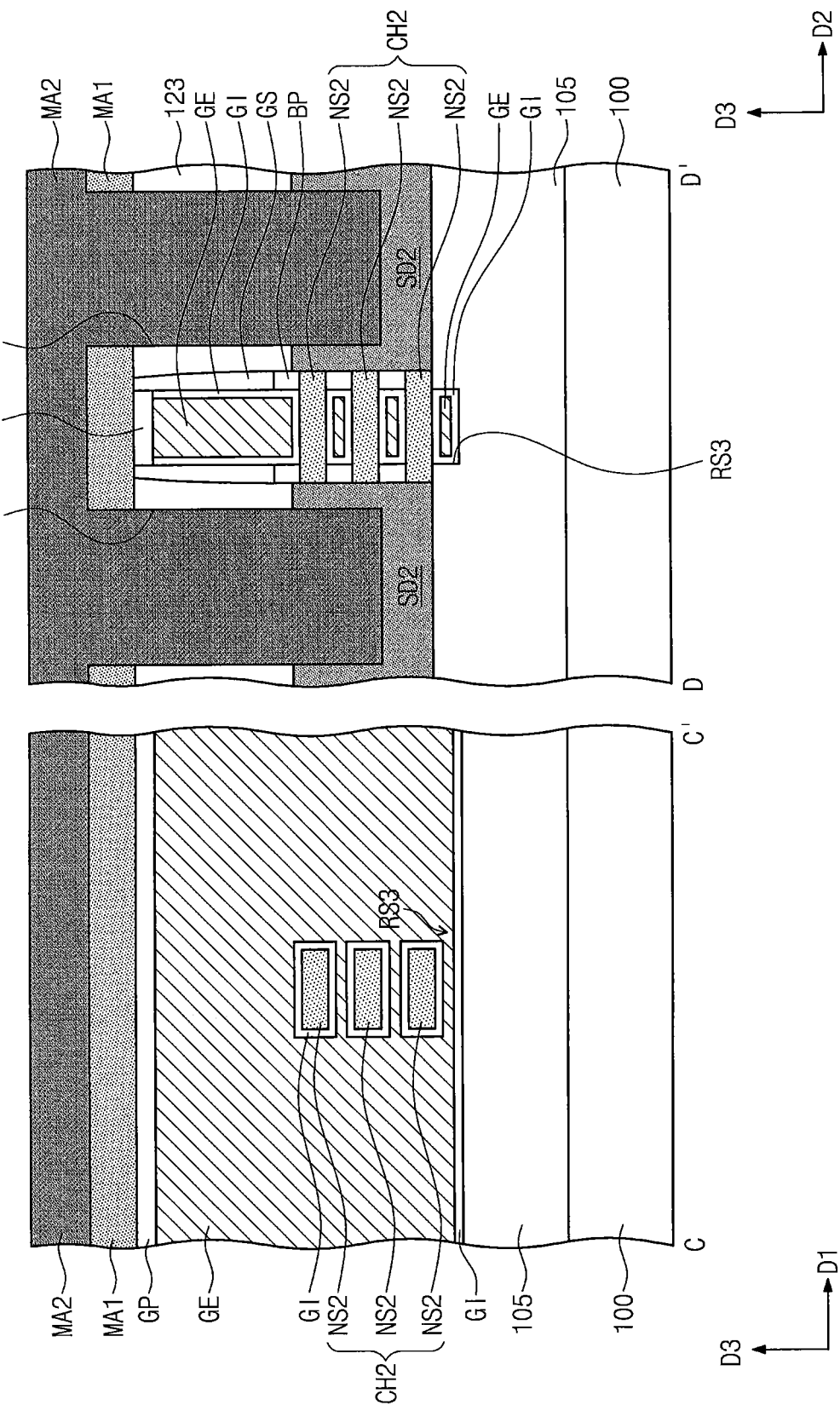

Referring to FIGS. 10A to 10C, on the fourth mask pattern MA1, a fifth mask pattern MA2 may be formed to be overlapped with the second active region AP2 when viewed in a plan view. The fifth mask pattern MA2 may not be overlapped with the first active region AP1, when viewed in a plan view. The fifth mask pattern MA2 may be formed to fill the first contact holes CTH1 exposing the second source/drain regions SD2 but not to fill the first contact holes CTH1 exposing the first source/drain regions SD1.

For example, the formation of the fifth mask pattern MA2 may include forming a second mask layer on the fourth mask pattern MA1 and patterning the second mask layer to form the fifth mask pattern MA2. The second mask layer may be formed to fill the first contact holes CTH1. However, a portion of the second mask layer on the first active region AP1 may be completely removed during the patterning process on the second mask layer. Accordingly, the first contact holes CTH1 exposing the first source/drain regions SD1 may be exposed by the fifth mask pattern MA2.

Thereafter, the first source/drain regions SD1 and the insulating layer 105 may be sequentially etched the fourth mask pattern MA1 and the fifth mask pattern MA2 as an etch mask, thereby forming second contact holes CTH2. The second contact holes CTH2 may be formed by further extending the first contact holes CTH1 toward the substrate 100. The second contact holes CTH2 may be formed to completely penetrate and extend through the first source/drain regions SD1.

Furthermore, when the second contact holes CTH2 are formed, the upper portion of the insulating layer 105 may be etched, and thus, first recess regions RS1 may be formed in the upper portion of the insulating layer 105. In other words, the first recess regions RS1 may be overlapped with the second contact holes CTH2, when viewed in a plan view. Bottoms CH2b of the second contact holes CTH2 (i.e., bottoms RS1b of the first recess regions RS1) may be positioned at a lower level than the top surface 105t of the insulating layer 105. However, the bottoms CH2b of the second contact holes CTH2 may be positioned at a higher level than the top surface of the substrate 100.

In some embodiments, a length of each of the second contact holes CTH2 in the first direction D1 may be longer than that of each of the first source/drain regions SD1 in the first direction D1. Accordingly, one of the first source/drain regions SD1 may be divided into a pair of first source/drain regions SD1 by a corresponding one of the second contact holes CTH2. In other words, the pair of the first source/drain regions SD1 may be spaced apart from each other in the second direction D2 with the second contact hole CTH2 interposed therebetween.

Referring back to FIGS. 1A to 1C, the fourth and fifth mask patterns MA1 and MA2 may be removed, and then, first and second contact plugs CT1 and CT2 may be formed. The first contact plugs CT1 may be formed to fill the second contact holes CTH2 respectively and the second contact plugs CT2 may be formed to fill the first contact holes CTH1 respectively. The first contact plugs CT1 may be directly connected to the first source/drain regions SD1, and the second contact plugs CT2 may be directly connected to the second source/drain regions SD2. In detail, a contact conductive layer may be formed in the first and second contact holes CTH1 and CTH2, and a planarization process may be performed on the contact conductive layer to form the first and second contact plugs CT1 and CT2. The contact conductive layer may be formed of or include at least one of conductive metal nitrides or metals.

Lower portions of the first contact plugs CT1 may be formed to fill the first recess regions RS1, respectively. Accordingly, bottom surfaces CT1b of the first contact plugs CT1 may be positioned at a lower level than that of the lowermost one of the first semiconductor patterns NS1. The first contact plugs CT1 may contribute to enhance a stress to be exerted on the first semiconductor patterns NS1. In other words, it is possible to exert a more intensive and/or more uniform tensile strain on the first channel region CH1.

The second contact plugs CT2 may be formed in such a way that bottom surfaces CT2b thereof are positioned at a level that is equal to or higher than the top surface 105t of the insulating layer 105. In other words, the bottom surfaces CT1b of the first contact plugs CT1 may be formed at a level different from that of the bottom surfaces CT2b of the second contact plugs CT2.

Figure 11A:
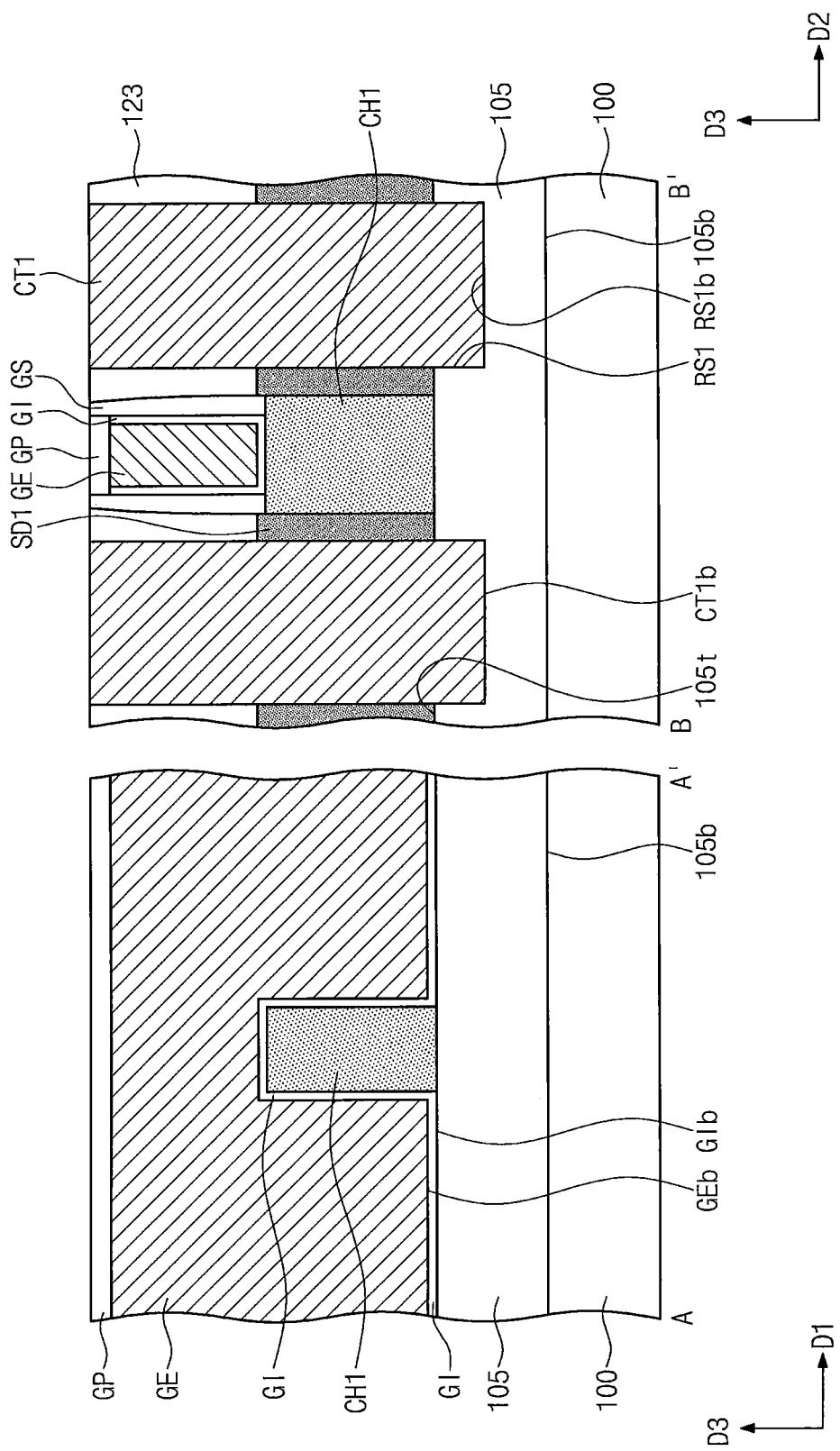
FIGS. 11A and 11B are sectional views illustrating a semiconductor device according to some embodiments of the inventive concepts.
Figure 11B:
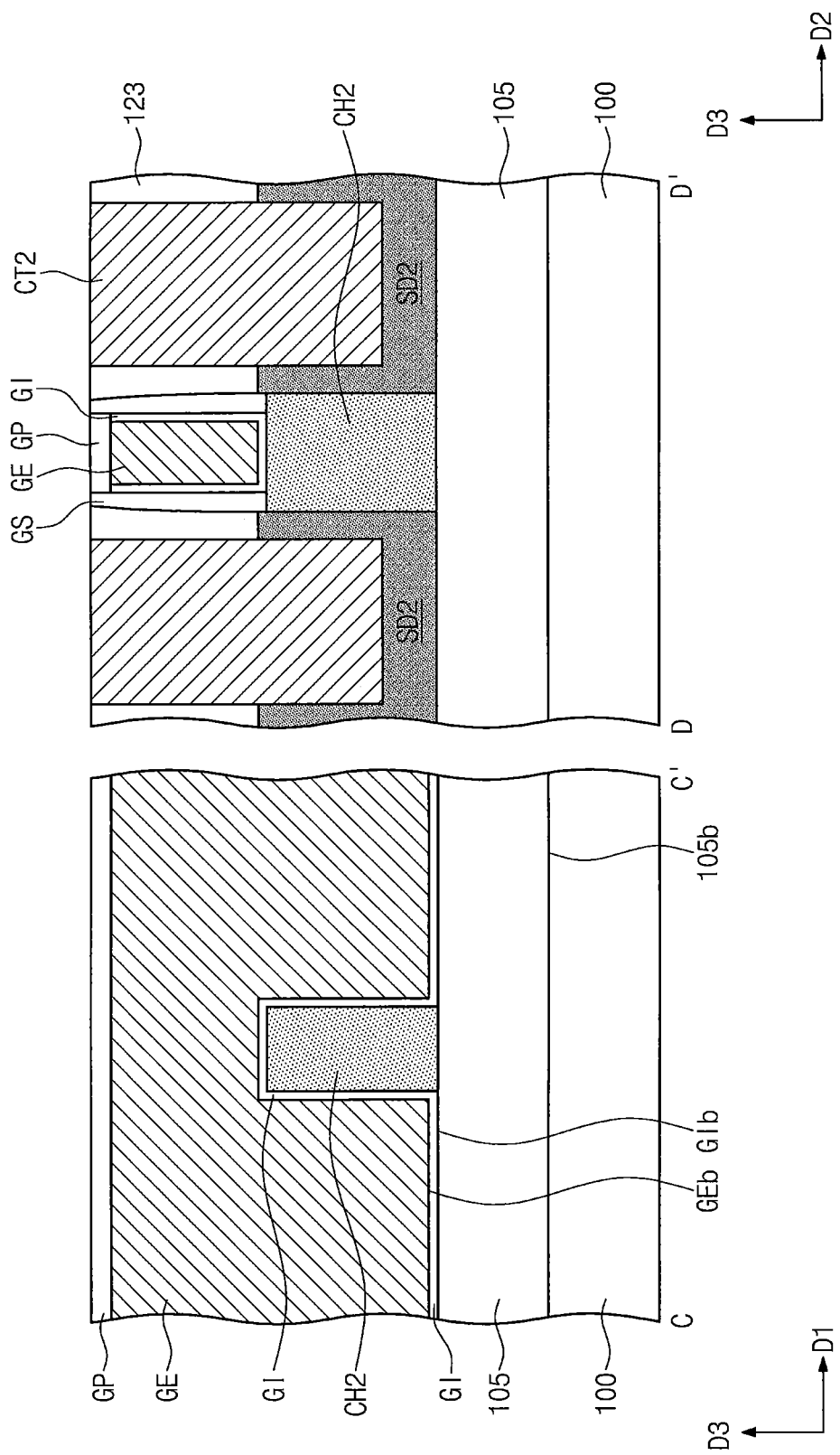

FIGS. 11A and 11B are sectional views illustrating a semiconductor device according to some embodiments of the inventive concepts. FIG. 11A is a sectional view taken along lines A-A' and B-B' of FIG. 1A, and FIG. 11B is a sectional view taken along lines C-C' and D-D' of FIG. 1A. In the following description, an element previously described with reference to FIGS. 1A to 1C may be identified by a similar or identical reference number without repeating an overlapping description thereof, for brevity.

Referring to FIGS. 1A, 11A, and 11B, the insulating layer 105 may be provided on the substrate 100, and first and second transistors TR1 and TR2 may be provided on the insulating layer 105. The first and second transistors TR1 and TR2 may have conductivity types different from each other. As an example, the first transistor TR1 may be an NMOSFET and the second transistor TR2 may be a PMOSFET.

The first and second transistors TR1 and TR2 may include first and second active regions AP1 and AP2, respectively. The first active region AP1 may include the first channel region CH1 and the first source/drain regions SD1, which are spaced apart from each other in the second direction D2 with the first channel region CH1 interposed therebetween. The second active region AP2 may include the second channel region CH2 and the second source/drain regions SD2, which are spaced apart from each other in the second direction D2 with the second channel region CH2 interposed therebetween.

In FIGS. 1B and 1C, the first channel region CH1 has been described to include a plurality of first semiconductor patterns NS1, but in the present embodiment, the first channel region CH1 may be a semiconductor pattern protruding in a third direction D3 perpendicular to the top surface of the substrate 100. Similarly, the second channel region CH2 may be a semiconductor pattern protruding in the third direction D3. Each of the first source/drain regions SD1 may be in direct contact with the side surface of the first channel region CH1. Each of the second source/drain regions SD2 may be in direct contact with the side surface of the second semiconductor pattern NS2.

The gate electrode GE and the gate insulating pattern GI may be provided to extend on or cover the first and second channel regions CH1 and CH2 and to extend in the first direction D1. For example, the gate electrode GE and the gate insulating pattern GI may extend on or cover both side surfaces and a top surface of each of the first and second channel regions CH1 and CH2.

In other words, in contrast with the gate-all-around type field effect transistor described with reference to FIGS. 1B and 1C, each of the first and second transistors TR1 and TR2 may be a fin field effect transistor having a channel region (e.g., CH1 and CH2), which is extended in the third direction D3 to face the gate electrode GE.

The first and second contact plugs CT1 and CT2 may be provided to penetrate the interlayered insulating layer 123 and may be connected to the first and second source/drain regions SD1 and SD2, respectively. Here, the lower portions of the first contact plugs CT1 may fill the first recess regions RS1, respectively, which are formed in the upper portion of the insulating layer 105.

Similar to the semiconductor device described with reference to FIGS. 1A to 1C, in the semiconductor device according to the present embodiment, the bottom surfaces CT1b of the first contact plugs CT1 connected to the first transistor TR1 may be positioned at a level that is different from that of the bottom surfaces CT2b of the second contact plugs CT2 connected to the second transistor TR2. This may make it possible to exert a tensile strain on the first channel region CH1 of the first transistor TR1 and a compressive strain on the second channel region CH2 of the second transistor TR2. As a result, it is possible to improve mobility of carriers, when the first and second transistors TR1 and TR2 are operated.

FIGS. 12A, 13A, 14A, 15A, and 16A are plan views illustrating methods of fabricating a semiconductor device, according to some embodiments of the inventive concepts. FIGS. 12B, 13B, 14B, 15B, and 16B are sectional views taken along lines A-A' and B-B' of FIGS. 12A, 13A, 14A, 15A, and 16A, respectively. FIGS. 13C, 14C, 15C, and 16C are sectional views taken along lines C-C' and D-D' of FIGS. 13A, 14A, 15A, and 16A, respectively. In the following description, an element previously described with reference to FIGS. 2A to 10C may be identified by a similar or identical reference number without repeating an overlapping description thereof, for brevity.

Figure 12A:
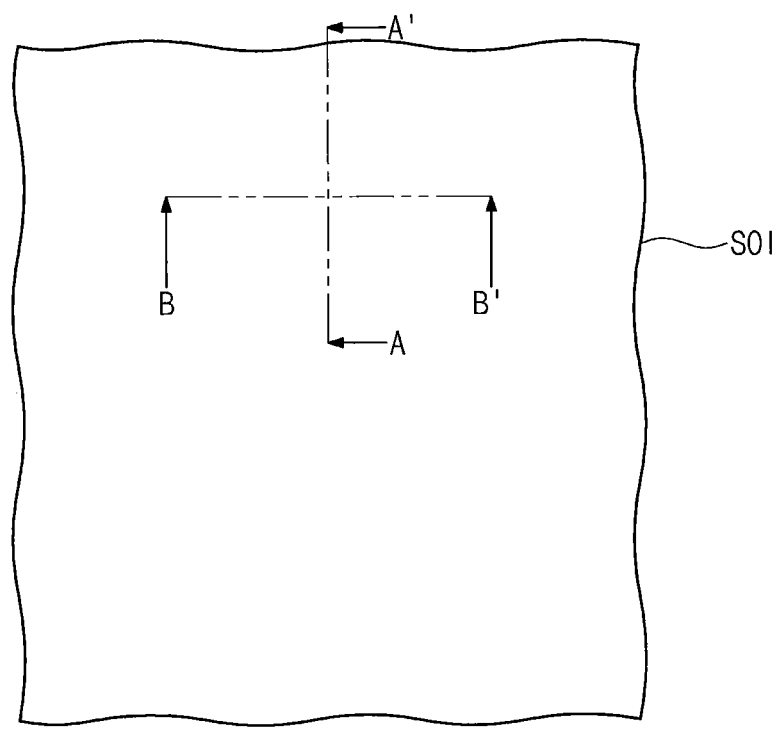
FIGS. 12A, 13A, 14A, 15A, and 16A are plan views illustrating methods of fabricating a semiconductor device, according to some embodiments of the inventive concepts.
Figure 12A:
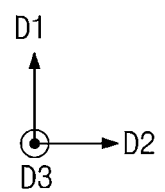
Figure 12B:
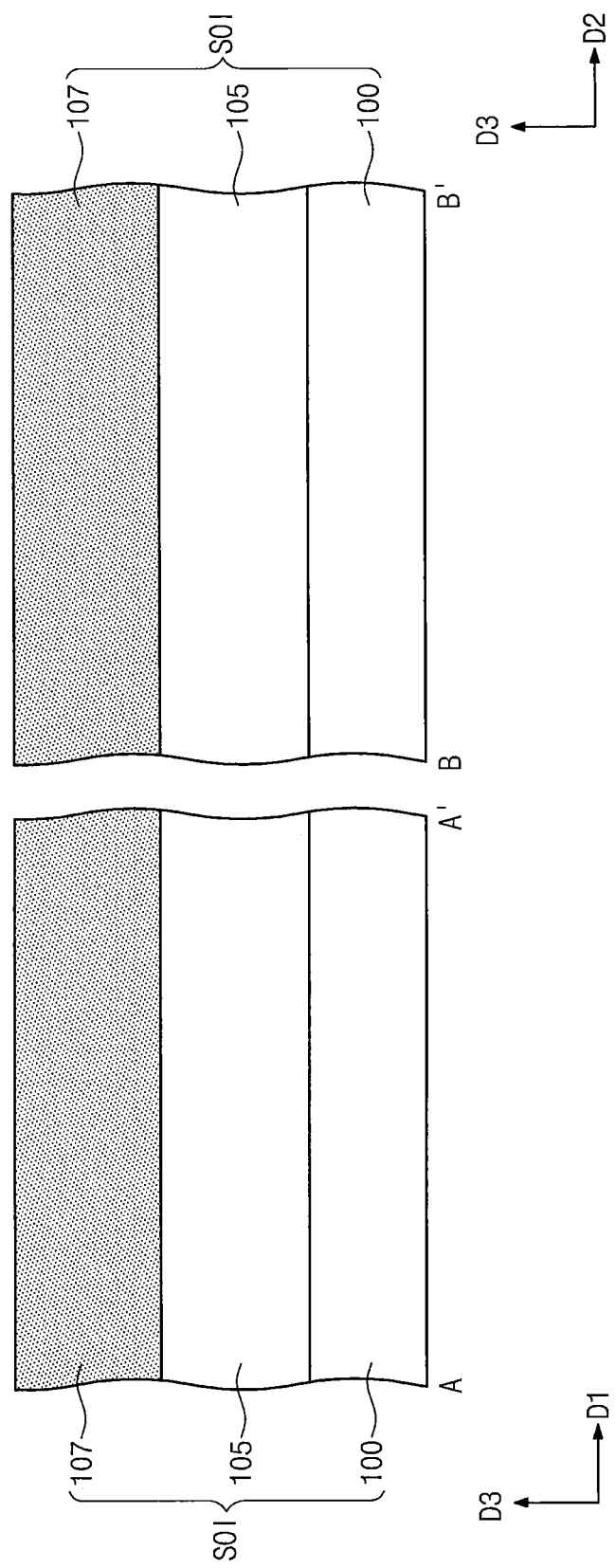

Referring to FIGS. 12A and 12B, an SOI substrate may be provided. The SOI substrate may include the substrate 100 serving as a handling substrate, the first semiconductor layer 107, and the insulating layer 105 interposed between the substrate 100 and the first semiconductor layer 107. In contrast with that described with reference to FIGS. 2A and 2B, the semiconductor device according to the present embodiment may not have the sacrificial layers 111 and the second semiconductor layers 112.

Figure 13A:
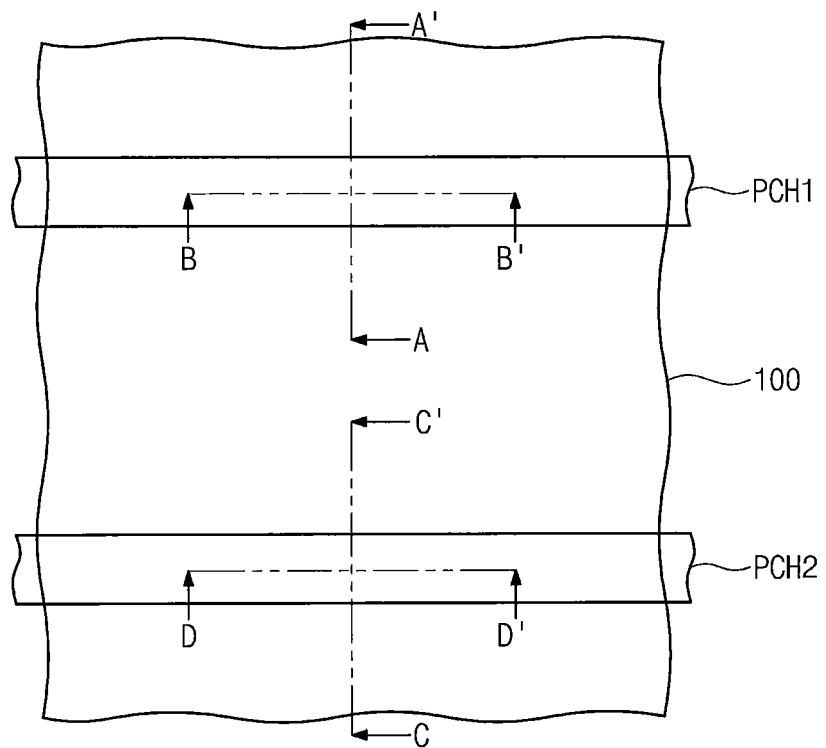
Figure 13A:
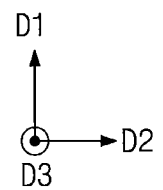
Figure 13C:
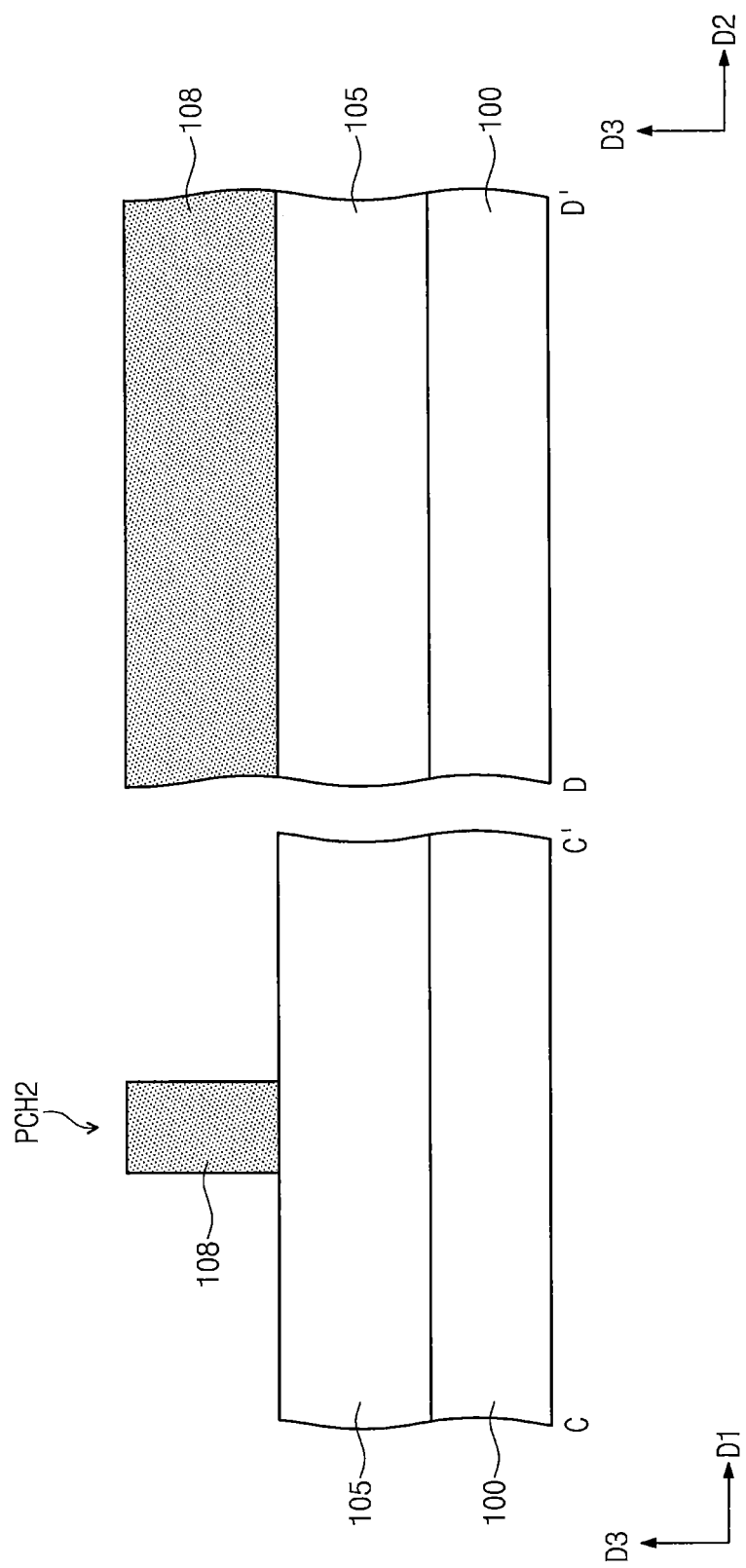
FIGS. 13C, 14C, 15C, and 16C are sectional views taken along lines C-C' and D-D' of FIGS. 13A, 14A, 15A, and 16A, respectively.

Referring to FIGS. 13A to 13C, the first semiconductor layer 107 may be patterned to form the first preliminary channel region PCH1 and the second preliminary channel region PCH2. In detail, the first semiconductor layer 107 may be patterned to form the first patterns 108. The first patterns 108 may be formed to have a line- or bar-shaped structure extending in the second direction D2. In addition, the first patterns 108 may protrude in the third direction D3 perpendicular to the top surface of the substrate 100. That is, the first patterns 108 may have a fin-shaped structure.

Figure 14A:
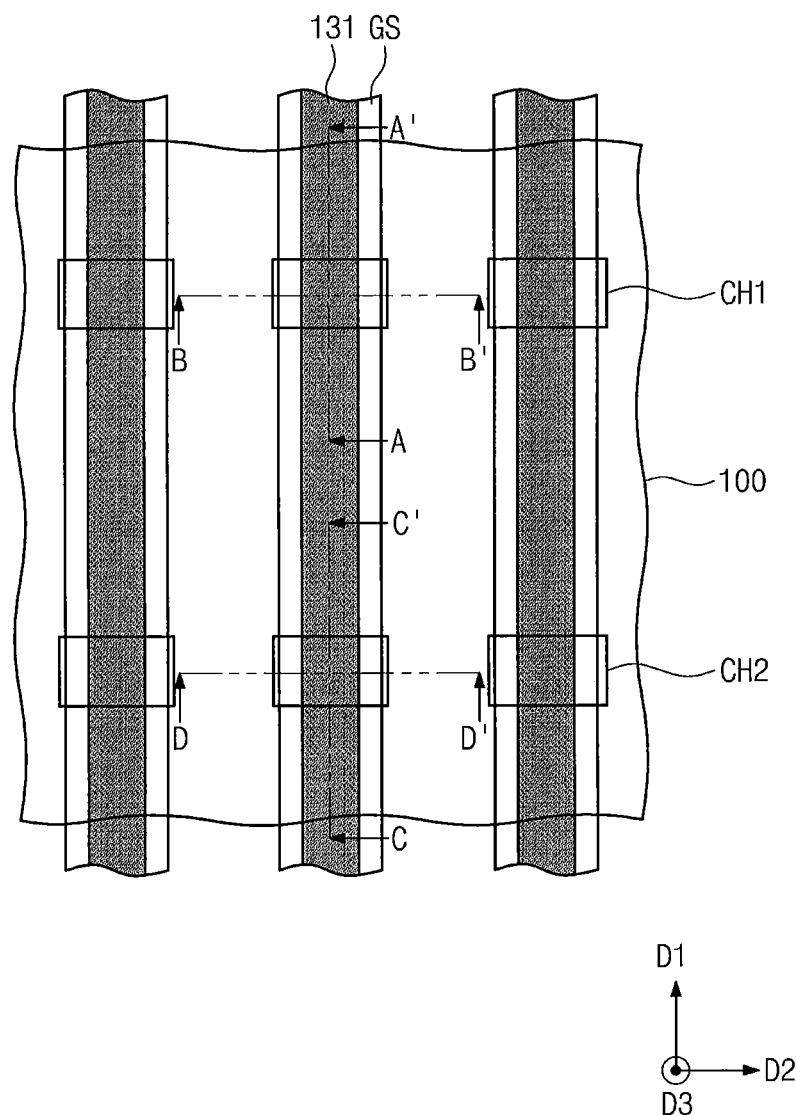
Figure 14B:
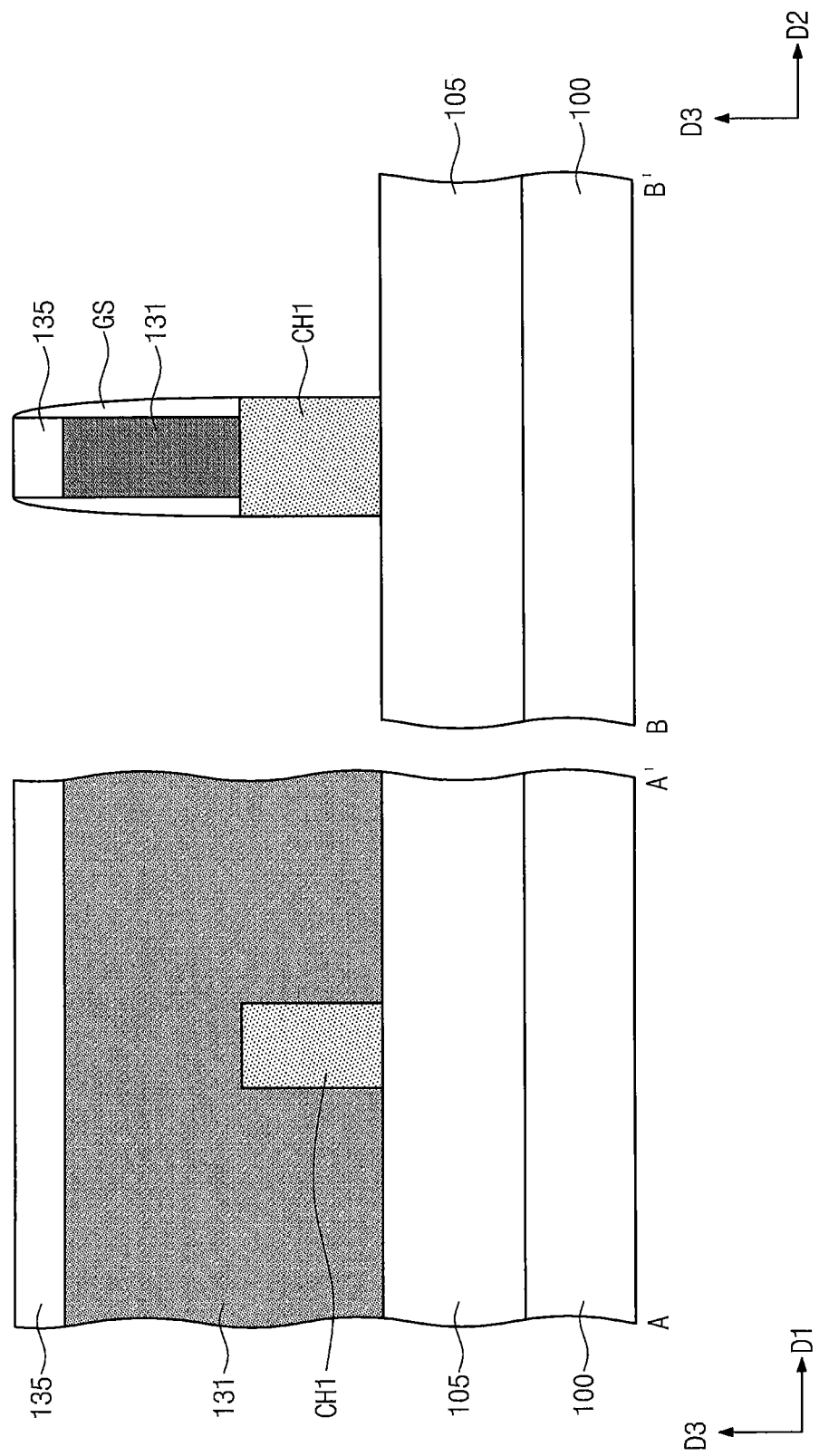
Figure 14C:
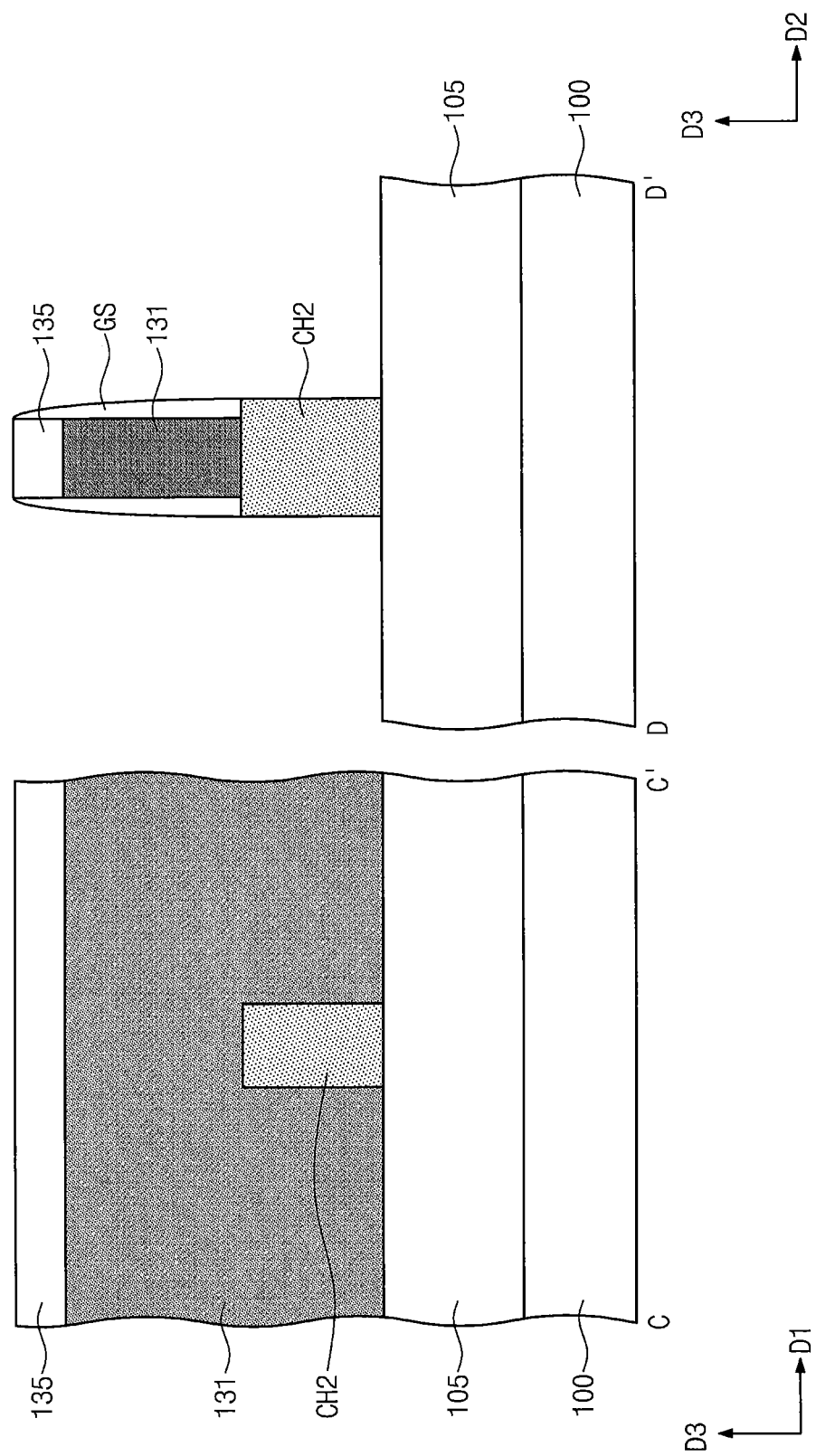

Referring to FIGS. 14A to 14C, the dummy gates 131 may be formed to cross the first and second preliminary channel regions PCH1 and PCH2. The dummy gates 131 may be formed to have a line- or bar-shaped structure extending in a first direction D1. The formation of the dummy gates 131 may include forming the gate mask patterns 135 on the dummy gates 131, respectively, and then forming the gate spacers GS on side surfaces of the dummy gates 131.

The first and second preliminary channel regions PCH1 and PCH2 may be patterned using the gate mask patterns 135 and the gate spacers GS as an etch mask to form the first and second channel regions CH1 and CH2, respectively. The first channel regions CH1 may be arranged in the second direction D2, and the second channel regions CH2 may be arranged in the second direction D2.

Figure 15A:
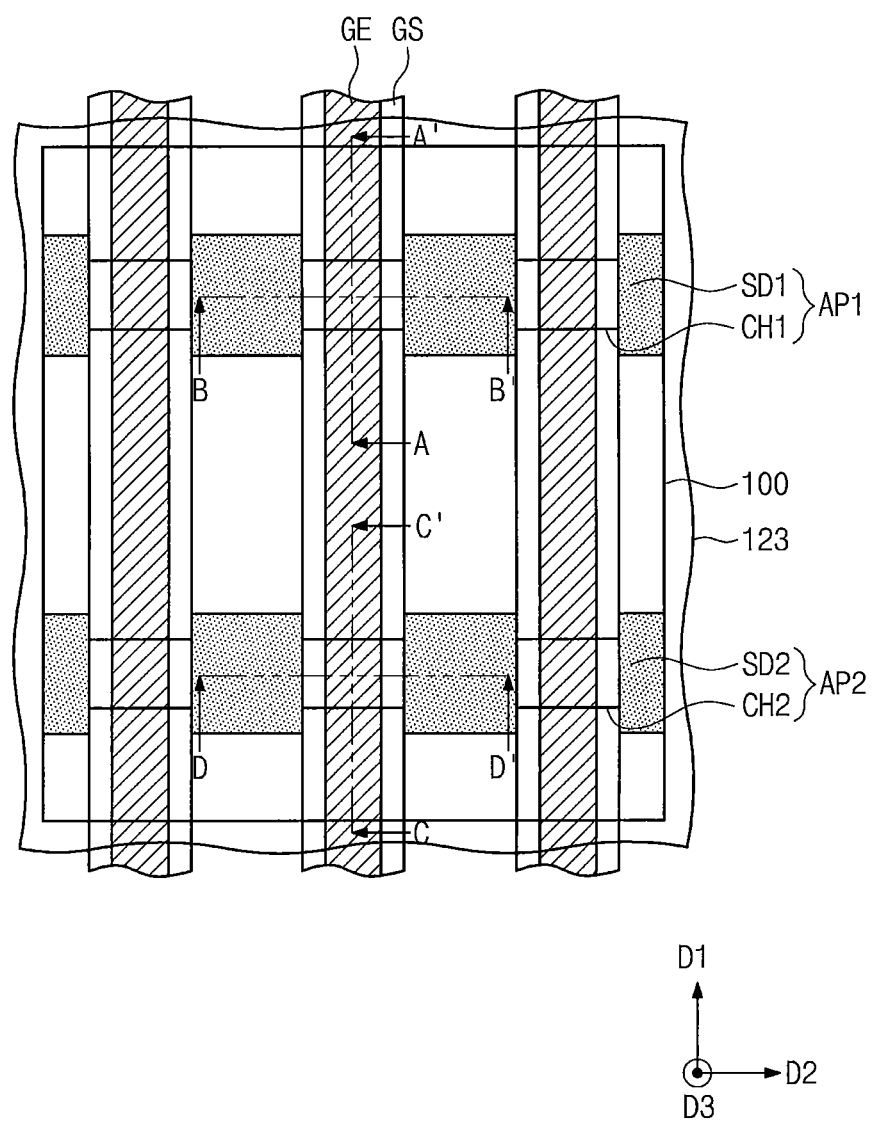
Figure 15B:
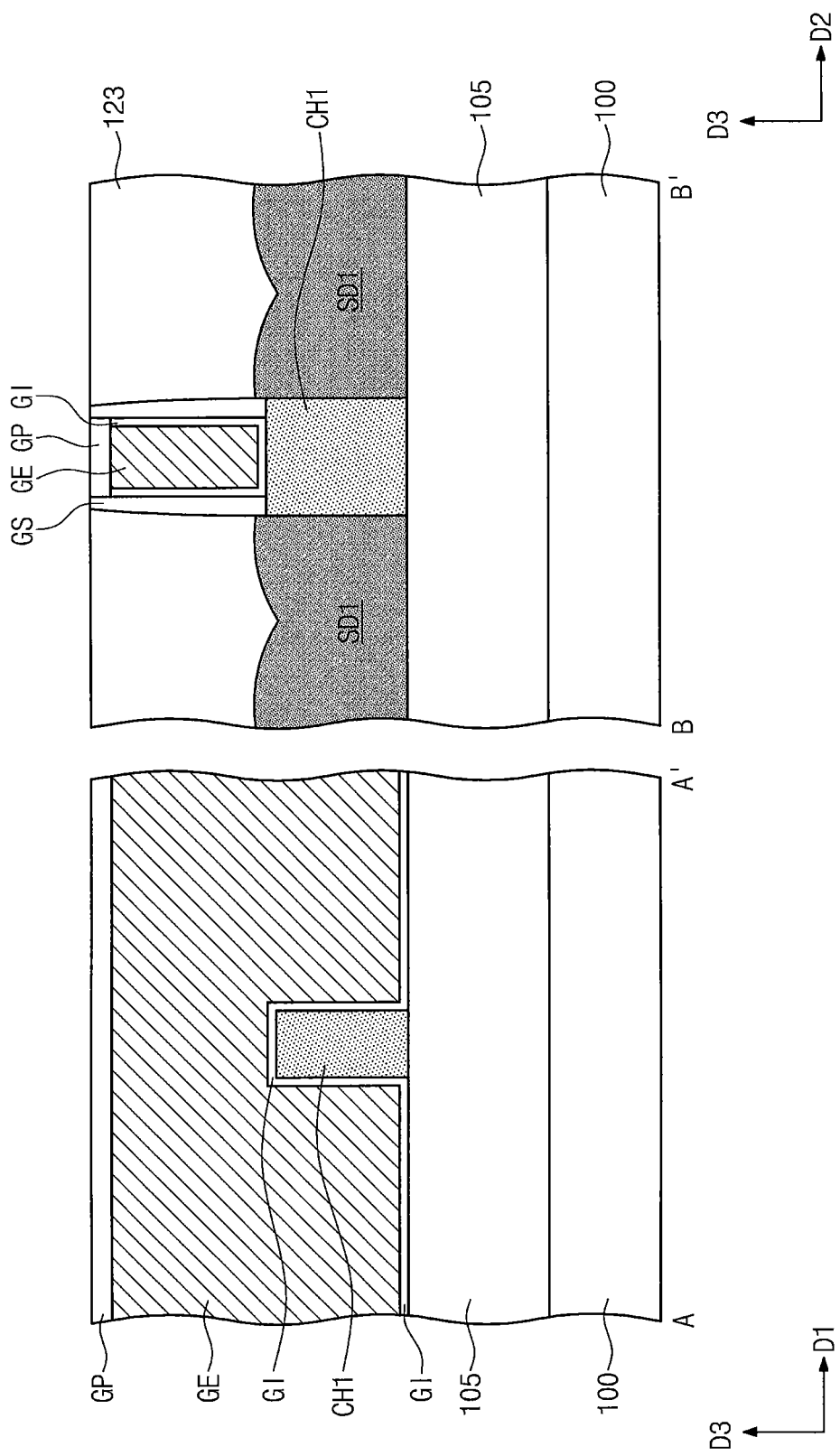
Figure 15C:
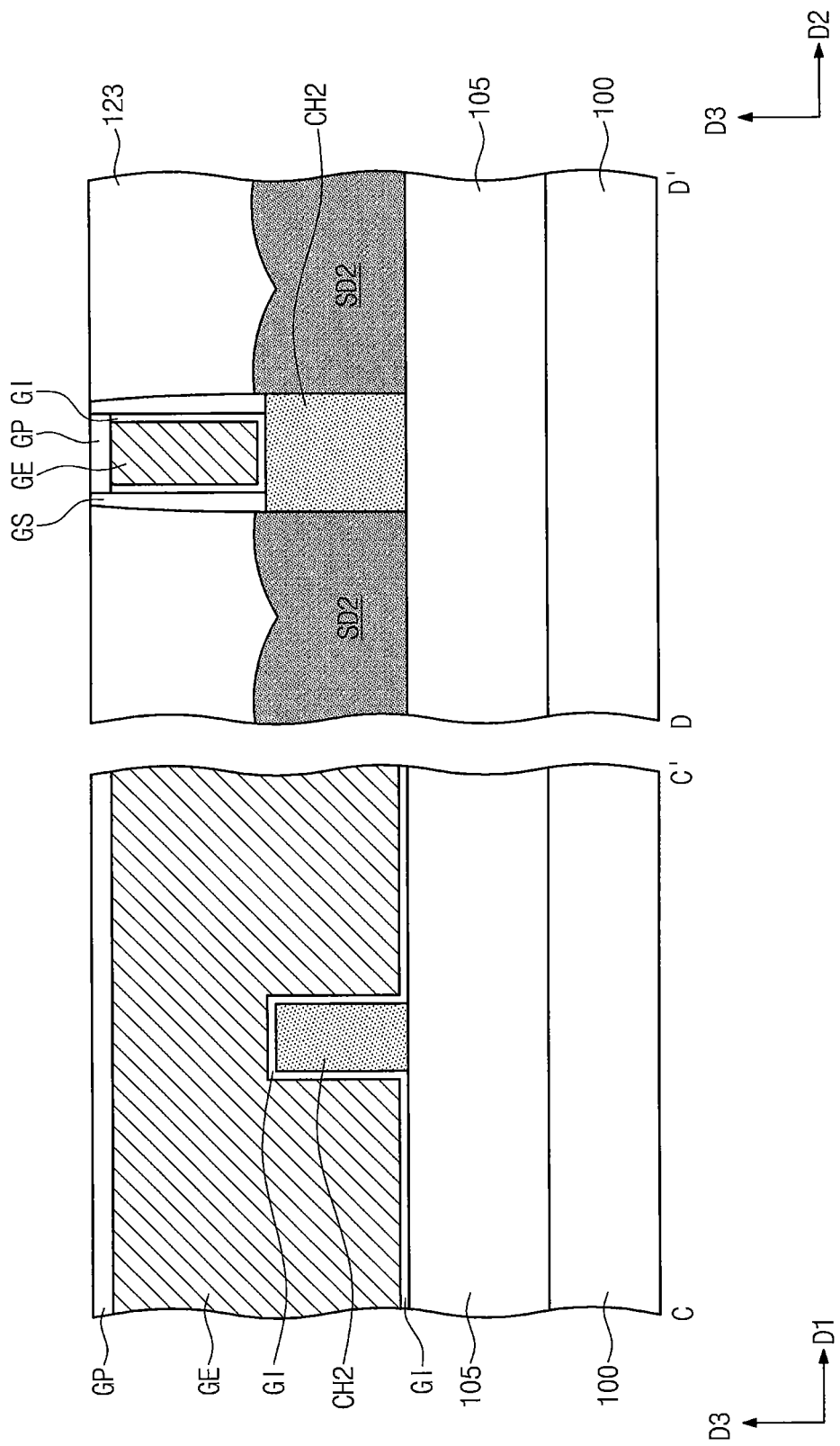

Referring to FIGS. 15A to 15C, the source/drain regions SD1 and SD2 may be formed at both sides of each of the dummy gates 131. For example, the first source/drain regions SD1 may be formed by a selective epitaxial process using a semiconductor pattern of each of the first channel regions CH1 as a seed layer. The second source/drain regions SD2 may be formed by a selective epitaxial process using a semiconductor pattern of each of the second channel regions CH2 as a seed layer. During or after the selective epitaxial process, the first and second source/drain regions SD1 and SD2 may be doped with impurities to have n- and p-type conductivities, respectively.

The first channel regions CH1 and the first source/drain regions SD1 may be connected to each other to constitute or define the first active region AP1 extending in the second direction D2. The second channel regions CH2 and the second source/drain regions SD2 may be connected to each other to constitute or define the second active region AP2 extending in the second direction D2.

The interlayered insulating layer 123 may be formed on the substrate 100. Thereafter, each of the dummy gates 131 may be replaced with the gate insulating pattern GI and the gate electrode GE. Here, the gate insulating pattern GI and the gate electrode GE may be sequentially stacked on the substrate 100 and may extend on or cover both side surfaces and a top surface of each of the first and second channel regions CH1 and CH2. Next, upper portions of the gate insulating patterns GI and the gate electrodes GE may be recessed, and the capping patterns GP may be formed in the recessed regions, respectively.

Figure 16A:
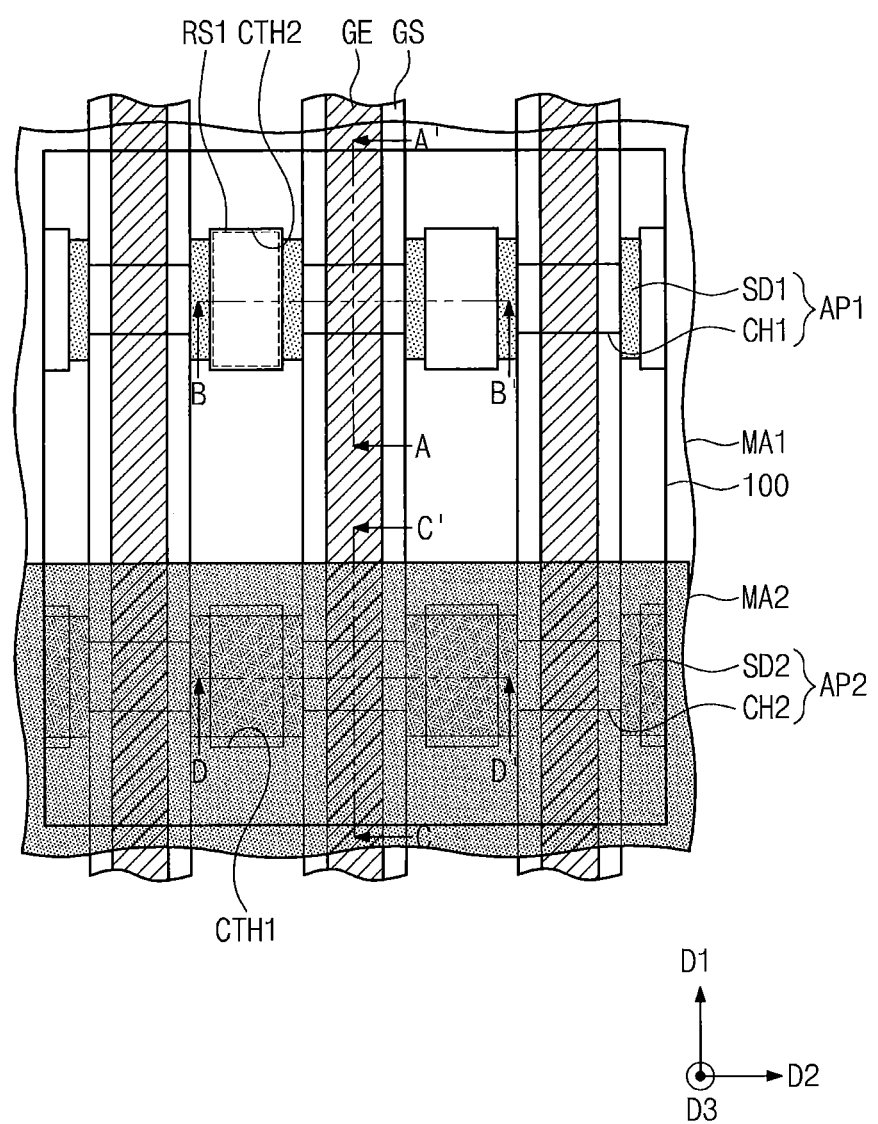
Figure 16B:
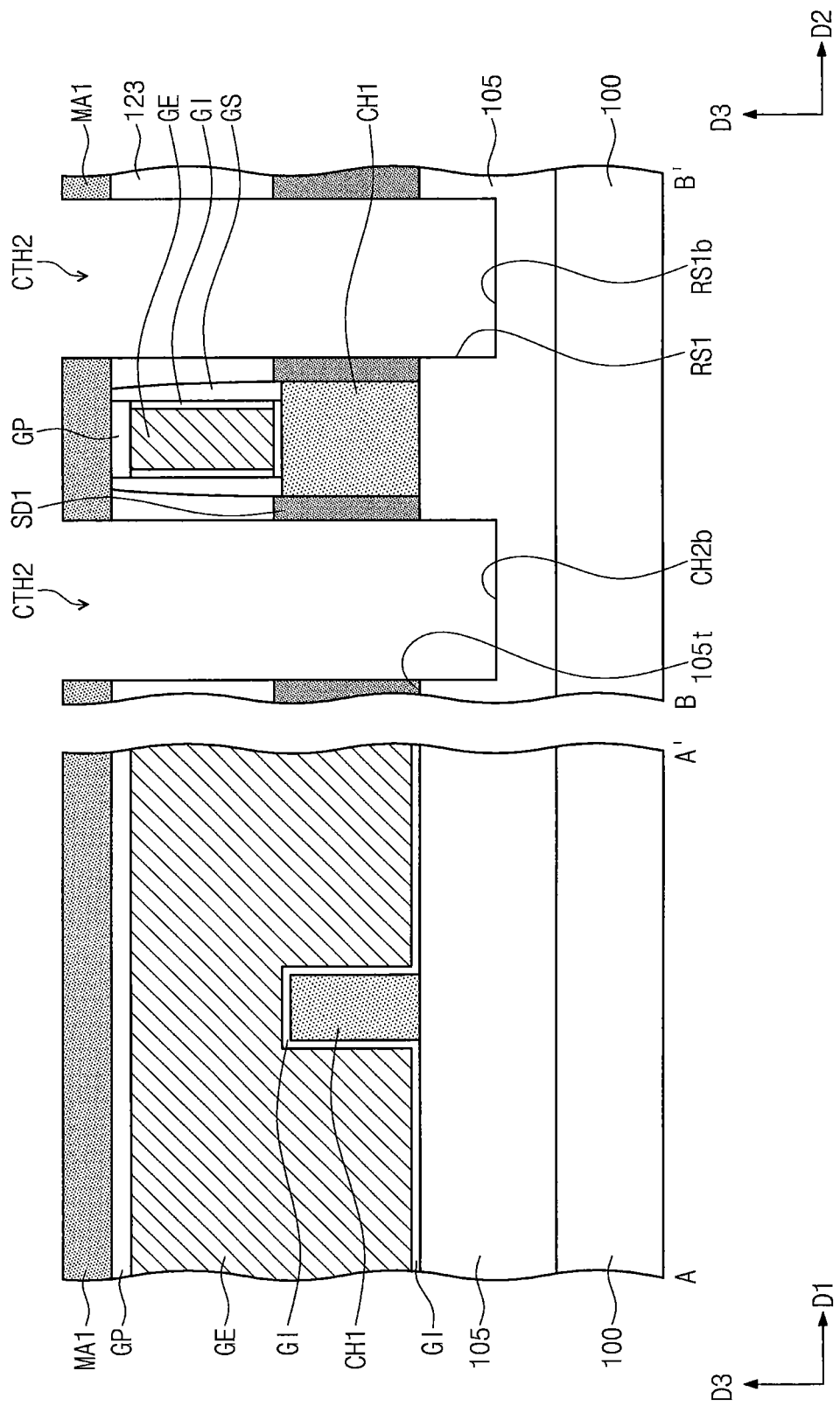
Figure 16C:
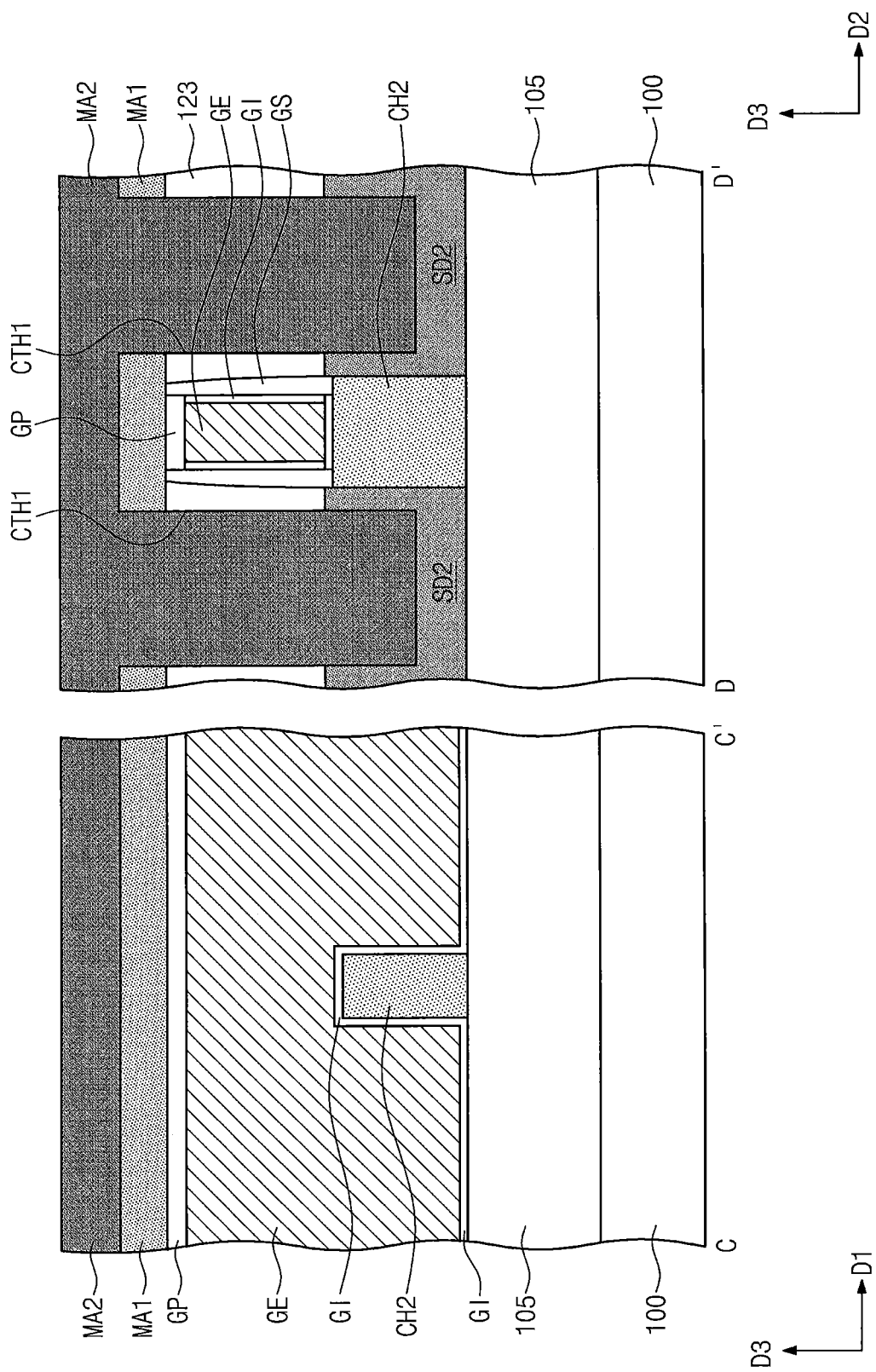

Referring to FIGS. 16A to 16C, the fourth mask pattern MA1 with openings may be formed on the interlayered insulating layer 123. The interlayered insulating layer 123 and the first and second source/drain regions SD1 and SD2 may be sequentially etched using the fourth mask pattern MA1 as an etch mask to form the first contact holes CTH1. The first contact holes CTH1 may not extend through the first and second source/drain regions SD1 and SD2 completely.

The fifth mask pattern MA2 may be formed on the fourth mask pattern MA1 to be overlapped with the second active region AP2 when viewed in a plan view. The first source/drain regions SD1 and the insulating layer 105 may be sequentially etched the fourth mask pattern MA1 and the fifth mask pattern MA2 as an etch mask, thereby forming the second contact holes CTH2.

Referring back to FIGS. 1A, 11A, and 11B, the fourth and fifth mask patterns MA1 and MA2 may be removed, and then, first and second contact plugs CT1 and CT2 may be formed. The first contact plugs CT1 may be formed to fill the second contact holes CTH2 respectively and the second contact plugs CT2 may be formed to fill the first contact holes CTH1 respectively.

In a semiconductor device according to some embodiments of the inventive concepts, it is possible to exert a stronger and/or more uniform tensile strain on a channel region of an NMOSFET and thereby to improve carrier mobility of the NMOSFET. Also, a compressive strain may be exerted on a channel region of a PMOSFET to improve the carrier mobility of the PMOSFET.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. That is, the regions illustrated in the figures are schematic in nature and their shapes are not intended to illustrate the actual shape of a region of a device and are not intended to limit the scope of example embodiments.

While example embodiments of the inventive concepts have been particularly shown and described, it will be understood by one of ordinary skill in the art that variations in form and detail may be made therein without departing from the spirit and scope of the attached claims.

What is claimed is:

1. A semiconductor device, comprising:
   a substrate;
   a first transistor on the substrate, the first transistor comprising a first channel region, first source/drain regions spaced apart from each other with the first channel region interposed therebetween, and a first gate structure crossing the first channel region in a direction,
   a second transistor on the substrate, the second transistor comprising a second channel region, second source/drain regions spaced apart from each other with the second channel region interposed therebetween, and a second gate structure crossing the second channel region in the direction,
   a first contact plug electrically connected to at least one of the first source/drain regions; and
   a second contact plug electrically connected to at least one of the second source/drain regions,
   wherein the first source/drain regions have conductivity types different from those of the second source/drain regions,
   wherein a bottom surface of the first contact plug is lower than a bottom surface of the at least one of the first source/drain regions, relative to the substrate, and
   wherein a bottom surface of the second contact plug is higher than a bottom surface of the at least one of the second source/drain regions, relative to the substrate.

2. The device of claim 1, wherein the first transistor is an NMOSFET, and the second transistor is a PMOSFET.

3. The device of claim 1, wherein each of the first and second channel regions comprises a plurality of semiconductor patterns that are stacked on the substrate and are spaced apart from each other.

4. The device of claim 3, wherein each of the first and second gate structures comprises a gate insulating pattern and a gate electrode, and
   the gate insulating pattern and the gate electrode extend between the semiconductor patterns.

5. The device of claim 1, wherein the bottom surface of the first contact plug is lower than a bottom surface of a lowermost portion of the first gate stucture.

6. The device of claim 1, wherein the bottom surface of the first contact plug is higher than a top surface of the substrate.

7. The device of claim 1, wherein the first source/drain regions and the second source/drain regions comprise respective semiconductor materials that are different from each other.

8. A semiconductor device, comprising:
   a substrate;
   source/drain regions on the substrate;
   a channel region between the source/drain regions, the channel region including a plurality of semiconductor patterns that are vertically spaced apart from each other on the substrate;
   a gate electrode on the channel region; and
   a contact plug extending towards the substrate through at least one of the source/drain regions,
   wherein a bottom surface of the contact plug is lower than a bottom surface of a lowermost portion of the gate electrode, relative to the substrate.

9. The device of claim 8, wherein the gate electrode extends between the semiconductor patterns.

10. The device of claim 8, wherein the channel region is vertically spaced apart from the substrate with an insulating layer interposed therebetween.

11. The device of claim 8, wherein the gate electrode is vertically spaced apart from the substrate with an insulating layer interposed therebetween.

12. The device of claim 8, wherein the contact plug is vertically spaced apart from the substrate with an insulating layer interposed therebetween.

13. The device of claim 8, wherein the source/drain regions, the channel region and the gate electrode constitute an NMOSFET.

* * * * *